US011719743B2

(12) United States Patent
Gopal et al.

(10) Patent No.: US 11,719,743 B2
(45) Date of Patent: Aug. 8, 2023

(54) METHOD AND APPARATUS FOR CONDUCTING BURN-IN TESTING OF SEMICONDUCTOR DEVICES

(71) Applicant: KES SYSTEMS, INC., Tempe, AZ (US)

(72) Inventors: Ballson Gopal, Tempe, AZ (US); Jesse Killion, Atlanta, GA (US)

(73) Assignee: KES SYSTEMS, INC., Tempe, AZ (US)

( * ) Notice: Subject to any disclaimer, the term of this patent is extended or adjusted under 35 U.S.C. 154(b) by 0 days.

(21) Appl. No.: 17/341,847

(22) Filed: Jun. 8, 2021

(65) Prior Publication Data
US 2021/0293877 A1   Sep. 23, 2021

Related U.S. Application Data

(62) Division of application No. 16/303,260, filed as application No. PCT/US2017/034647 on May 26, 2017, now Pat. No. 11,061,069.
(Continued)

(51) Int. Cl.
*G01R 31/28* (2006.01)
*G01R 1/04* (2006.01)

(52) U.S. Cl.
CPC ....... *G01R 31/2874* (2013.01); *G01R 1/0458* (2013.01); *G01R 1/0466* (2013.01);
(Continued)

(58) Field of Classification Search
CPC .............. G01R 1/0458; G01R 1/0466; G01R 31/2862; G01R 31/2863; G01R 31/2867;
(Continued)

(56) References Cited

U.S. PATENT DOCUMENTS 5,021,732 A   6/1991 Fuoco et al.
6,084,215 A   7/2000 Furuya et al.
(Continued)

FOREIGN PATENT DOCUMENTS

EP   2309247 A1   4/2011
EP   2778696 A2   9/2014
(Continued)

OTHER PUBLICATIONS

Extended European Search Report issued in EP application No. 17807586.4 dated Jan. 2, 2020.
(Continued)

*Primary Examiner* — Jay Patidar
(74) *Attorney, Agent, or Firm* — Botos Churchill IP Law LLP

(57) ABSTRACT

A method and apparatus for conducting burn-in testing of semiconductors is provided. A semiconductor device under test (DUT) with a plurality of contact pads is placed into a seal carrier. The seal carrier is then placed within a plurality of first inner walls of an outer housing of a burn-in testing apparatus that is fastened to a cold plate through a printed circuit board (PCB). The seal carrier has a plurality of second inner walls that define a recessed cavity. A lid is placed over the seal carrier and fastened to the outer housing to seal the recessed cavity. The recessed cavity is pneumatically pressurized to force the contact pads of the semiconductor DUT into electrical contact with a plurality of resiliently compressible pins of a socket of the PCB. The socket is then energized to conduct a burn-in test of the semiconductor DUT.

9 Claims, 19 Drawing Sheets

Related U.S. Application Data

(60) Provisional application No. 62/344,790, filed on Jun. 2, 2016.

(52) U.S. Cl.
CPC ..... *G01R 31/2862* (2013.01); *G01R 31/2863* (2013.01); *G01R 31/2867* (2013.01)

(58) Field of Classification Search
CPC ............ G01R 31/2874; G01R 31/2875; G01R 31/2877
See application file for complete search history.

(56) References Cited

U.S. PATENT DOCUMENTS

| | | |
|---|---|---|
| 7,114,556 B2 | 10/2006 | Hamilton et al. |
| 7,486,094 B2 | 2/2009 | Chyan |
| 8,274,300 B2 | 9/2012 | Sakaue et al. |
| 2002/0135389 A1 | 9/2002 | Melgaard et al. |
| 2004/0036492 A1 | 2/2004 | Gaasch et al. |
| 2004/0077200 A1 | 4/2004 | Ishikawa et al. |
| 2005/0206368 A1 | 9/2005 | Lopez et al. |
| 2006/0066293 A1 | 3/2006 | Gopal et al. |
| 2007/0040569 A1 | 2/2007 | Gopal et al. |
| 2008/0090429 A1 | 4/2008 | Mok et al. |
| 2009/0183866 A1* | 7/2009 | Sakaue ............ G05D 23/1904 165/287 |
| 2010/0125377 A1 | 5/2010 | Kim et al. |
| 2010/0141287 A1* | 6/2010 | Scocchetti ......... G01R 31/2874 324/750.3 |
| 2011/0316577 A1 | 12/2011 | Lindsey et al. |
| 2014/0055156 A1 | 2/2014 | Johnson et al. |
| 2016/0091559 A1 | 3/2016 | Teoh |

FOREIGN PATENT DOCUMENTS

| | | | |
|---|---|---|---|
| JP | H07263504 A | * | 10/1985 |
| JP | H09320720 A | * | 12/1997 |
| KR | 20060008379 A | | 1/2006 |
| KR | 20100093896 A | | 8/2010 |
| KR | 20110046053 A | | 5/2011 |
| KR | 101039614 B1 | | 6/2011 |
| KR | 101296817 B1 | | 8/2013 |
| KR | 20160007139 A | | 1/2016 |
| MY | 151795 A | | 7/2014 |
| TW | 201142320 A | | 12/2011 |

OTHER PUBLICATIONS

International Search Report and Written Opinion from corresponding International Application No. PCT/US2017/034647 dated Aug. 14, 2017.

* cited by examiner

METHOD AND APPARATUS FOR CONDUCTING BURN-IN TESTING OF SEMICONDUCTOR DEVICES

CROSS-REFERENCE TO RELATED APPLICATIONS

This application is a divisional of U.S. patent application Ser. No. 16/303,260, filed Nov. 20, 2018, allowed, which application is a national phase entry under 35 U.S.C. § 371 of International Application No. PCT/US2017/034647 filed May 26, 2017, published in English. which claims the benefit of the filing date of U.S. Provisional Application No. 62/344,790 filed Jun. 2, 2016, the entire disclosure of which is hereby incorporated by reference.

BACKGROUND OF THE INVENTION

Semiconductor devices, i.e., microchips, integrated circuits, light emitting diodes, etc., are tested after fabrication to identify those devices that will meet performance and lifetime specifications. A variety of tests are conducted, both before and after the semiconductor device is packaged. These tests are able to identify performance through failure of the device during simulation of operational conditions.

The sequence of testing performed on semiconductor devices typically involves some initial electrical tests followed by environmental testing. Environmental testing is also known as burn-in testing. The phrase "burn-in" is used because the test is performed at an elevated temperature. Burn-in typically involves placing a large number of semiconductor devices, which may be referred to as a Device Under Test, or DUT(s), on printed circuit board(s) ("PCB"). The PCB(s) are typically placed in a chamber in which the environmental conditions, particularly temperature, are controlled. The semiconductor devices ("IC") devices are then subjected to electrical tests at an elevated temperature. Thus, thermal and electrical stresses are applied to the semiconductor devices, via the PCB(s), to accelerate the failure of those devices that would otherwise fail early on. Such failure allows identification of devices that fail to perform according to their minimum specifications. Performance of this test ensures that failed devices are identified and kept from being used, ensuring that devices sold to consumers are more reliable.

The burn-in test can take many hours to perform and the temperature of the semiconductor devices are held in the range of about 100° C. to about 140° C. during the test. In addition, the semiconductor devices may be subjected to ten percent to thirty percent higher than normal voltage. Consequently, since the power dissipation during burn-in is significantly higher than under normal operation, the extra power dissipation makes it even more difficult to control the temperature of the semiconductor device during burn-in. Although it is desirable to keep the temperature of the semiconductor device as high as possible during the burn-in in order to minimize the amount of time required for this test, the temperature must not be so high as to damage the semiconductor devices that are otherwise acceptable.

The latest semiconductor devices, especially microprocessors, have even higher electrical consumption in accordance with their higher frequency of operation. The higher electrical consumption causes the semiconductor devices to generate heat over 100 watts. In the burn-in of these devices, the heat generated when these devices are continuously connected with electricity at constant high temperature (e.g., about 125° C.) can be catastrophic. Other semiconductor devices such as LEDs also generate heat. Unless these heat-generating semiconductor devices are appropriately cooled to a controlled or desired temperature, the burn-in testing equipment itself might be destroyed in addition to the semiconductor devices under test.

Existing systems that include a device that conducts heat away from a semiconductor device under test include, for example, U.S. Pat. No. 8,274,300, which is hereby incorporated by reference herein. However, existing systems pose many challenges. One problem with existing burn-in and testing systems is the difficulty in removing heat generated by the electrical power supplied to test a semiconductor circuit. This problem is exacerbated where testing involves a plurality of interconnected semiconductor circuits on a wafer or a plurality of individual singulated circuits on a substrate. In such cases, the heat generated is often so severe that testing is confined to a small quantity of circuits at any given time. This leads to a single test being done in several batches to avoid disrupting the system due to overheating. Other adverse effects due to heat include damage to the circuits themselves and degradation of the pin(s) supporting the wafer or substrates, particularly where the burn-in process or cycle lasts several hours or more.

Another difficulty with burn-in testing involving a large number of semiconductor circuits is that more pogo pins are required to connect to the larger number of devices. Each additional pogo pin requires added effort to ensure that each contact pad below the wafer and above the pogo pin is properly secured. Also, because the wafer or substrate is thin in dimension, the transfer of force from the load of the circuits to be tested, through the contact pad, and into the pogo pin must be pre-determined prior to loading and testing and must be monitored to ensure it is maintained throughout the burn-in test cycle.

Thus, there is a need for a system that can provide improved heat transfer capacity, particularly where a large number of semiconductor devices are placed under burn-in and testing conditions.

DETAILED DESCRIPTION

Figure 1:
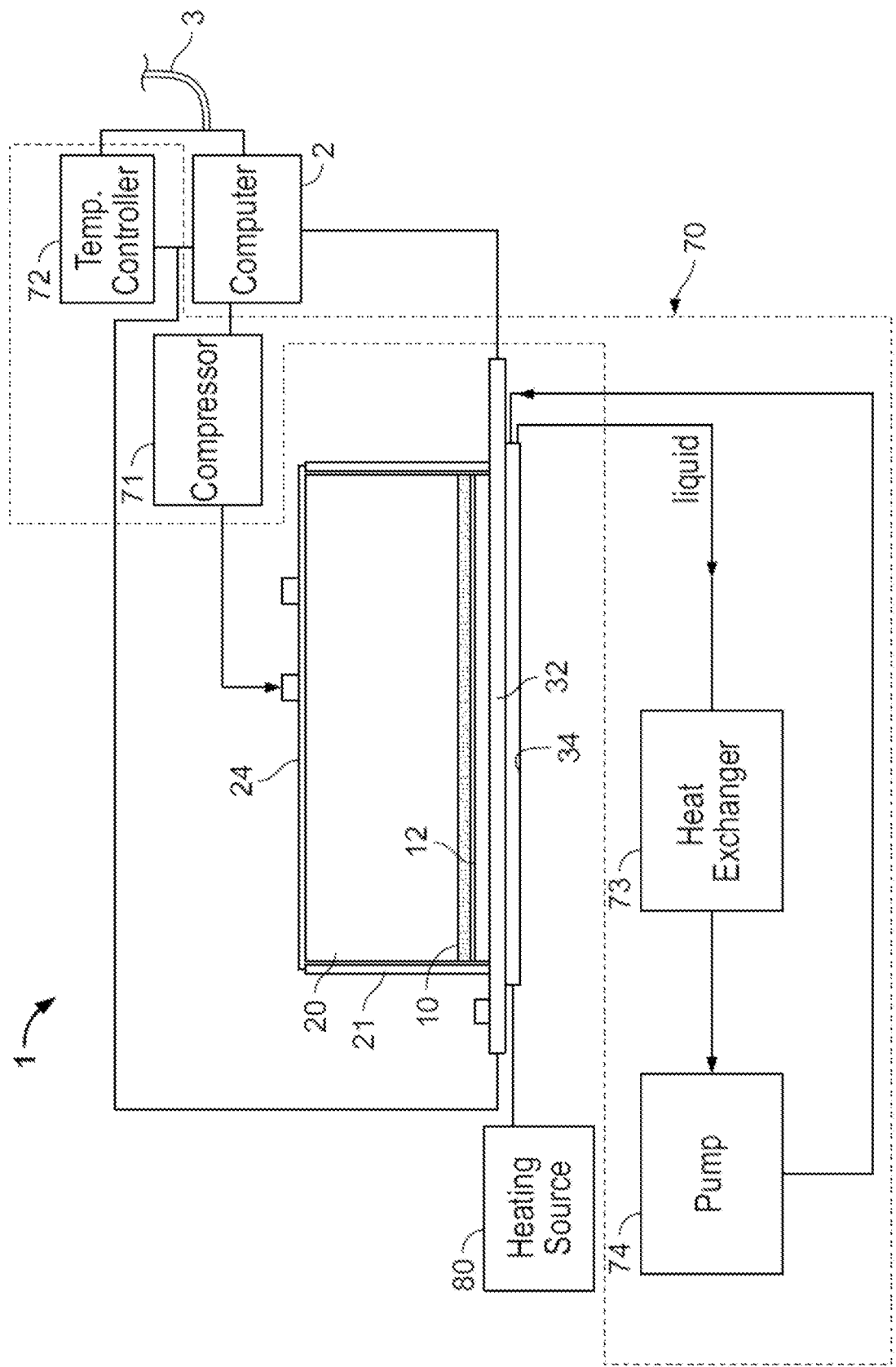
FIG. 1 illustrates a first embodiment of the system including assembly, outer housing, seal carrier, PCB and cold plate.

Some versions of the present technology include burn-in test apparatus for semiconductor devices. The test apparatus may include an outer housing forming an aperture with a test socket to receive a tile, the tile comprising at least one semiconductor device for burn-in testing. The test apparatus may include a thermal control unit configured to regulate temperature associated with the burn-in testing. The test apparatus may include drive electronics for controlling powering of DUTs during the burn-in testing. The test apparatus may include an inlet for gas pressure from a pressure source. The test apparatus may include a lid to cover the aperture when a tile is at the test socket. The test apparatus may include a seal carrier located within the aperture to form a pressure chamber with a first surface of the tile, the pressure chamber pneumatically coupled with inlet.

In some versions, the seal carrier may include a flange with a flexible seal. The flexible seal may extend from the flange for contacting the first surface of the tile. The flexible seal may include a perimeter skirt for engaging a perimeter of the tile when the tile is in the test socket. The test apparatus may include a lid seal. The lid seal may be configured to maintain a pressure of the pressure chamber. The lid seal may be positioned to seal surfaces of the lid and the seal carrier. The lid seal may be positioned to seal surfaces of the lid and the outer housing. The seal carrier and the lid may form an integrated lid assembly. The seal carrier may have a limited range of movement relative to the lid. The lid may comprise a trunk portion, a cap portion, a perimeter rim portion and a channel portion. The channel portion may be between the trunk portion and perimeter rim portion. The trunk portion of the lid may extend within a central aperture of the seal carrier. An extension portion of the seal carrier may be configured to traverse within the channel portion of the lid. The seal carrier may be spring biased with respect to the lid. The bias may be away from the lid. Optionally, opposing surfaces of the seal carrier that are exposed to gas pressure of the chamber may have matching areas for neutralizing gas pressure forces applied to the opposing surfaces of the seal carrier by pneumatic pressure of the pressure chamber. The opposing surfaces of the seal carrier that may be exposed to gas pressure of the chamber have unmatched areas for biasing gas pressure applied to opposing surfaces of the seal carrier by pneumatic pressure of the pressure chamber.

In some versions, the lid may include a cold plate. The cold plate may form the pressure chamber with the seal carrier. The cold plate may include a circuitous channel for directing fluid flow about the cold plate, such channels form a flow path to snake around sensor mounts through the lid and/or cold plate. The circuitous channel may include a plurality of raised tabs along a path of the circuitous channel. The lid may include an electromagnetic radiation absorbing coating to absorb radiation within the pressure chamber. A trunk of the lid may form a manifold for fluid circulation adjacent to the cold plate. The lid may further include a fluid inlet and a fluid outlet for the fluid circulation. The lid may include one or more sensors. The one or more sensors may be for sensing a temperature condition associated with the tile. A sensor of the one or more sensors may be configured to sense a temperature condition of a top surface of the tile. Optionally, the apparatus may include pressure source. The pressure source may include a compressor. The pressure chamber may be configured to apply pressure from the inlet to the tile to urge the tile into electrical contact with the test socket. The pressure chamber may be configured to apply gas pressure from the inlet to the tile to urge the tile into thermal contact with a thermal conductor of the test socket.

The test socket may include a printed circuit board. The printed circuit board may be configured with electrical contacts on a first surface side of the printed circuit board for energizing the tile when the tile is seated in the test socket. The test socket may include a plurality of pins. The plurality of pins may be spring biased and configured to engage electrically with conductive contact pads on a second surface of the tile opposite the first surface and to engage electrically with the first surface side of the printed circuit board. The pressure chamber may be configured to apply pressure from the inlet to the tile to urge the tile to compress the pins.

The socket may include a cold plate. The cold plate may include a set of thermally conductive extensions with edges configured to contact a second surface of the tile. The second surface may be opposite the first surface. The set of thermally conductive extensions may each have a thermal interface material at its contact surface. The cold plate may be formed of an electrically conductive material and may serve as a part of an electrical circuit of the test socket for energizing the tile when the tile is seated in the socket. The cold plate may include a raised platform portion from which the set of thermally conductive extensions extend. A peripheral grove may be formed in the cold plate about the raised platform. The cold plate may be in electrical contact with conductive pads of a second surface side of the printed circuit board. The second surface side may be opposite the first surface side. The cold plate may include groves to receive contacts coupled to the printed circuit board on a second surface side of the printed circuit board. The cold plate may be configured as an electrical ground in the electrical circuit. The cold plate may be located below the socket and a printed circuit board of the socket. The set of thermally conductive extensions of the cold plate may extend through slots of the printed circuit board of the socket.

The test apparatus may include a tile carrier configured to automatically move the tile to the test socket when the lid exposes the aperture. The tile carrier may include a vacuum chuck to hold the tile by vacuum force. The tile carrier may include a multi-axis pick and place robot. The lid may include an electro-mechanical and/or pneumatic lift to automatically raise and lower the lid for insertion and removal of the tile from the test socket. The test socket may include alignment apparatus to automatically move the tile to a burn-in position in the test socket. The alignment apparatus may include any one or more of: one or more pneumatic actuators, one or more wheels, one or more fixed positional references, and one or more position sensors.

The test apparatus may include a tile receptacle. The tile receptacle may include alignment apparatus to automatically align the tile to a lift position in the tile receptacle for lifting by a pick and place robot. The test apparatus may include a controller. The controller may be configured to control any one or more of: control automatic operation of the lid to open and close the test socket; control automatic operation of a pick and place robot that moves the tile into and from the test socket when movement of the lid exposes the aperture; control drive electronics for powering the test socket to conduct burn-in testing of the tile; and control the thermal control unit to regulate a temperature of the burn-in test apparatus during the burn-in testing of the tile.

Some versions of the present technology may include a method for conducting burn-in testing of semiconductor devices. The method may include using any of the burn-in test apparatus described herein to burn-in test a tile.

Some versions of the present technology may include a method for conducting burn-in testing of semiconductor devices. The method may include placing a semiconductor device under test (DUT) into a socket of a burn-in testing apparatus. The method may include closing a lid of the burn-in testing apparatus to enclose the semiconductor DUT within a pressurizable chamber of the burn-in testing apparatus. The method may include pneumatically pressurizing the chamber by a gas pressure source so as to urge the semiconductor DUT into electrical and/or thermal contact with the test socket. The method may include energizing the test socket to conduct a burn-in test of the semiconductor DUT. The method may include opening the lid of the burn-in testing apparatus. The method may include retrieving the tested semiconductor DUT from the test socket.

In some versions, the method may include engaging a flexible seal with a first side surface of the semiconductor DUT, the flexible seal engaging the semiconductor DUT for pressurizing the chamber. In some versions, pneumatically pressurizing the chamber may apply a force to the first side surface to compress a set of pins of the socket that contact semiconductor DUT on a second side surface of the semiconductor DUT. The flexible seal may engage with the first side surface of the semiconductor DUT at a perimeter of the semiconductor DUT. Closing the lid may engage the flexible seal. The method may include regulating heat of the chamber with a cold plate positioned adjacent to the first side surface of the semiconductor DUT. The method may include absorbing electromagnetic energy or light into the cold plate, the electromagnetic energy or light generated by a semiconductor DUT during the burn-in testing. The energizing of the socket may apply electrical energy through a cold plate that is in electrical contact with a printed circuit board of the socket. The method may include transferring heat from a second side of the semiconductor DUT where the second side of the semiconductor DUT may be in contact with the cold plate.

In some versions, the method may include controlling operation of an actuator to automatically align the semiconductor DUT in the socket. The method may include controlling operation of an actuator to automatically align the semiconductor DUT in a holding receptacle. The method may include controlling automatic operation of the lid to open and close the test socket. The method may include controlling automatic operation of a pick and place robot that moves the semiconductor DUT into the test socket when a movement of the lid exposes the test socket. The method may include controlling automatic operation of the pick and place robot that moves the semiconductor DUT from the test socket when a further movement of the lid exposes the test socket.

DETAILED DESCRIPTION

As used herein, upward refers to a direction away from a ground surface upon which the system is supported and downward refers to a direction towards the ground surface upon which the system is supported. For example, if the system is placed over a floor in a laboratory, then the floor would be the ground surface in that instance.

One aspect of the present invention relates to a system 1 for use in performing electrical stress tests, i.e., burn-in tests, on semiconductors. At a minimum, electricity is supplied through a printed circuit broad ("PCB") 32 to a wafer, tile or substrate for testing. The system 1 includes a seal carrier 20 for supporting the wafer 10, the seal carrier 20 disposed in an outer housing 21 that is secured to a cold plate 34 through the PCB 32. The wafer, tile or substrate can extend across the entire opening of the seal carrier 20 so that a compliant or flexible seal of the of the seal carrier 20 can contact and provide a pressure seal against the wafer, tile or substrate such as at an outer perimeter edge of the wafer, tile or substrate or other DUT. An electronic semiconductor circuit device or DUT, such as a microprocessor chip or LED, is placed adjacent the seal carrier 20 so that it may be subjected to testing performed by the system 1. The DUT can also be any electronic, mechanical or another device.

In many embodiments, the system further may have a control unit such as one that includes test instrumentation that measures data from the semiconductor under test and a computer 2 that receives data for use in the control of settings relating to electricity and/or temperature. This may typically include the drive electronics for controlling application of electrical current to the socket for powering the DUTs during testing. The system can also include an assembly 70 that houses a compressor 71, temperature controller 72, chilled water refrigerant (not shown), heat exchanger 73, and a pump 74. These components can be arranged using any means known to those of skill in the art. Of course, any combination of these components can form one or more assemblies and in some embodiments the computer is part of an assembly. For example, in some versions a pressure source (e.g., compressor) may be external, such as a pressure supply from a work shop compressor. In some such cases, the assembly may then have an inlet (not shown) for pressure from the pressure source. The inlet may couple with a valve, which may optionally be controlled by the computer, such as for regulating the desired pneumatic pressure (e.g., above atmospheric pressure) of the system as discussed in more detail herein. Electricity is supplied 3 as shown or based on other arrangements determined as a matter of design choice. The test instrumentation, computer and a test jig are interconnected as illustrated in the example of FIG. 1. As referred to herein, a test jig may be understood to refer to a cold plate, a printed circuit board (PCB), a test socket, which may include multiple sockets, a seal carrier, lid and outer housing.

Figure 3:
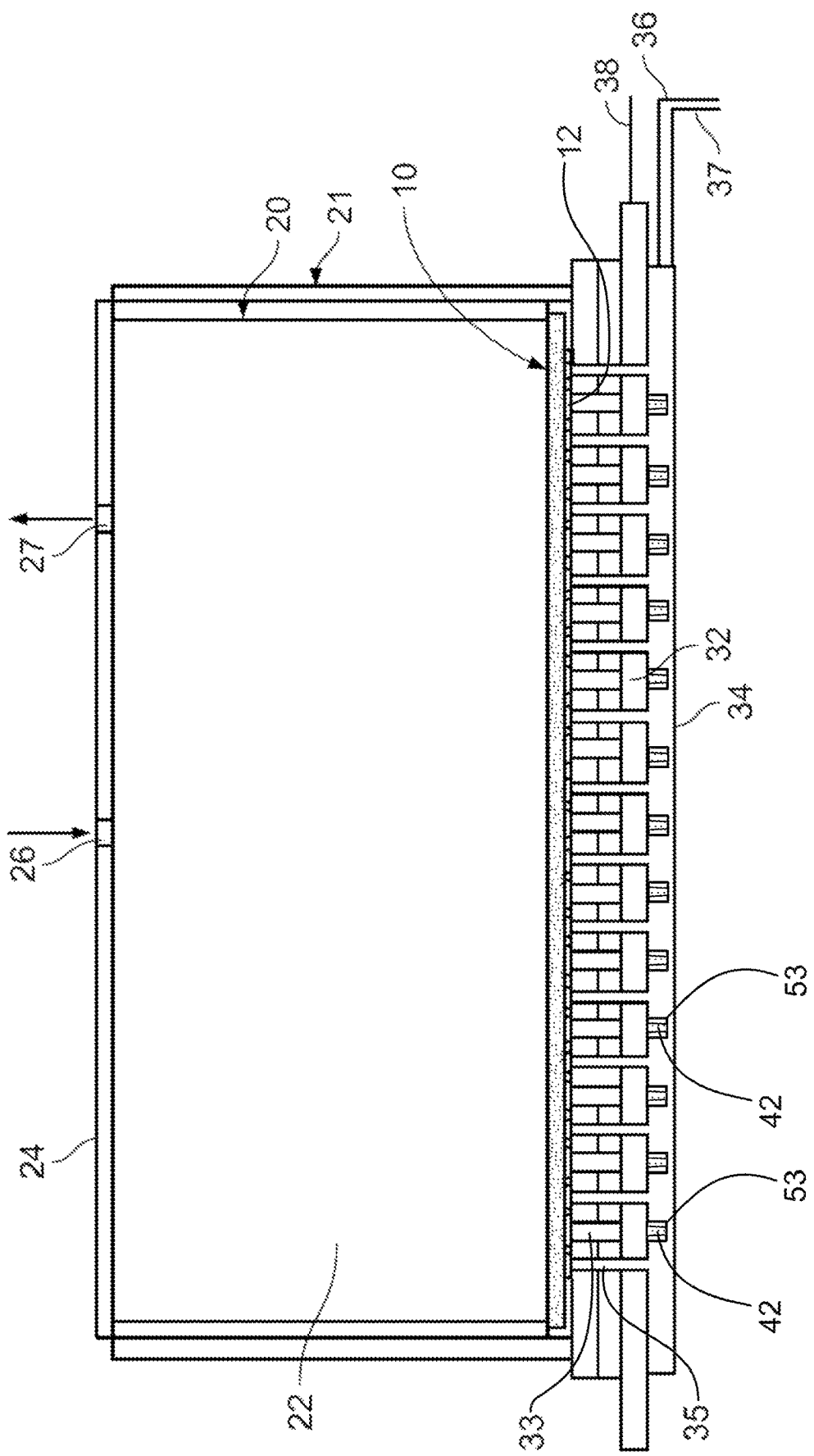
FIG. 3 illustrates a close up view of the outer housing of FIG. 1.
Figure 4:
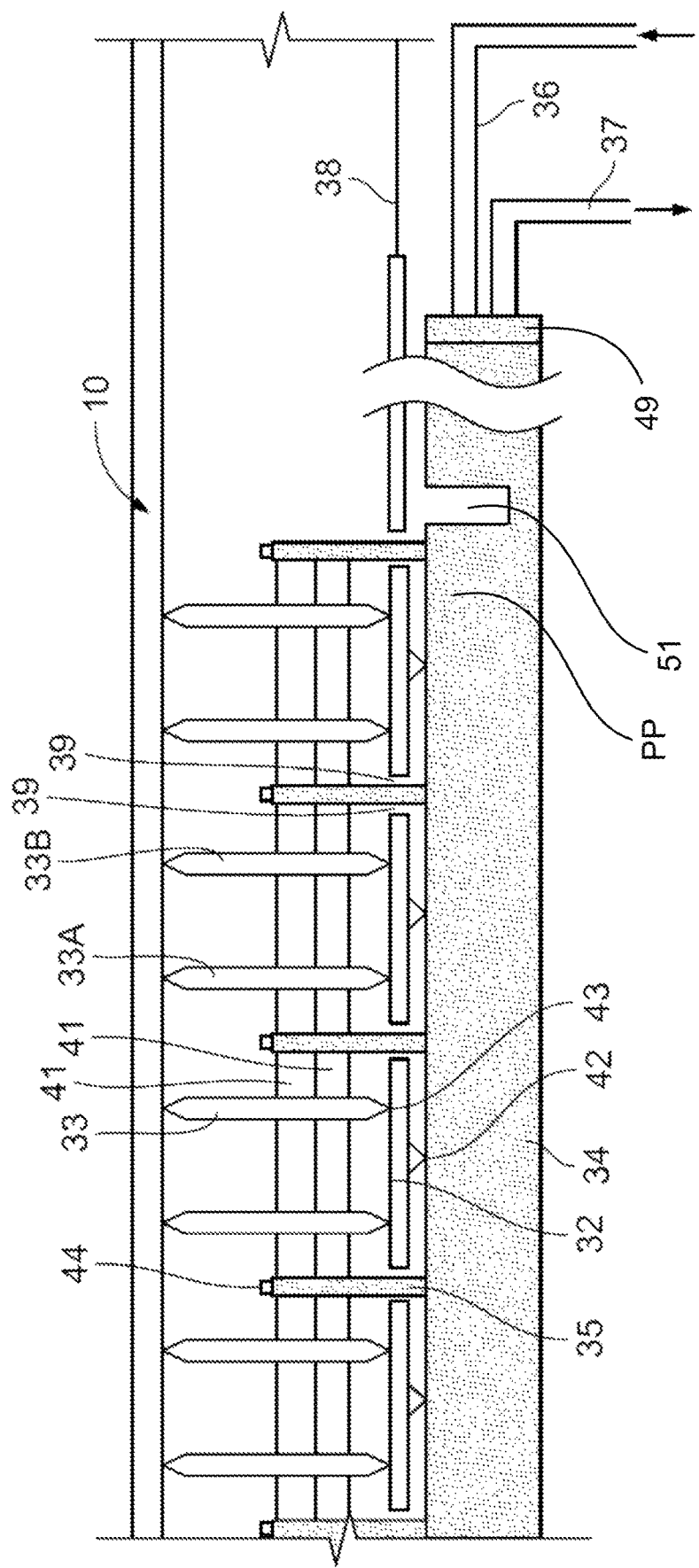
FIG. 4 illustrates a close up sectional view of the PCB and cold plate of FIG. 1 when the springs of the pogo pins are not loaded or not compressed.

In a first embodiment, the cold plate 34 of the system 1 is as shown in FIGS. 1 and 3. The cold plate is made of copper material; however, other thermally conductive materials can be used in alternative embodiments. The cold plate 34 includes extensions 35 (FIG. 3) that extend through slots 39 (FIG. 4) that are cut or otherwise formed in the PCB 32 so that the extensions 35 extend through the PCB 32, and extend from the PCB 32 as best shown in FIGS. 3 and 4. The extensions 35 are made of the same material as the remainder of the cold plate 34 but variations in the material composition are contemplated. For example, the properties of the copper can vary from one location to another in the cold plate to the extent it is desirable to have such variations for the purposes of thermal or electrical conductivity. The extensions 35 are sized so that when the seal carrier 20 with wafer 10 is placed into the outer housing 21, the extensions make contact with the underside of the wafer 10 under at least some conditions. For example, when pneumatic pressure is applied from a pressure source into a recessed cavity 22 of the seal carrier, the recessed cavity 22 serves as a pressure chamber. As visible in FIG. 3, increased pressure applies a force so that the position of the wafer 10 moves closer to the PCB 32 to make contact with a top end of extensions 35. In the embodiment shown in FIG. 4, the extensions 35 include thermal interface material 44 ("TIM") at a top surface of the extensions. The addition of TIM 44 to the extensions lowers resistance between the wafer and extension and therefore aids thermal conductivity of the system 1.

The cold plate 34 also includes an inlet 36 to receive fluid, such as a liquid, that provides the heat transfer capabilities of the cold plate 34. The fluid can remove heat expelled from the DUTs. In the cold plate, the fluid absorbs expelled heat. The heated fluid is then circulated out from the cold plate 34 through outlet 37. To distribute the fluid from the inlet 36 to other parts of the cold plate 34, the cold plate 34 may include as system of interconnected manifolds (not shown) for the fluid to travel through and increase the surface contact between the fluid and the internal surface of the cold plate. The manifolds and internal surfaces of the cold plate can be arranged to promote temperature uniformity within the DUTs. The fluid received at the inlet 36 is delivered via a pump. The fluid outside of the cold plate may be circulated through a heat exchanger 73 where it may be cooled. The fluid may be any fluid type that is compatible for use with a cold plate 34 or any other type known to those of skill in the art considering the temperatures and materials of the system 1.

In a variant, a heating source 80 may optionally be integrated or implemented with the cold plate 34 as shown in FIG. 1. In such a case, operation of the heating source 80 can increase the temperature of the cold plate 34 and/or increase the temperature of the fluid during testing. For example, if there is insufficient heat in the DUT for testing purposes, the heating source 80 can be operated to increase the temperature of the DUT to desired testing conditions.

Figure 5:
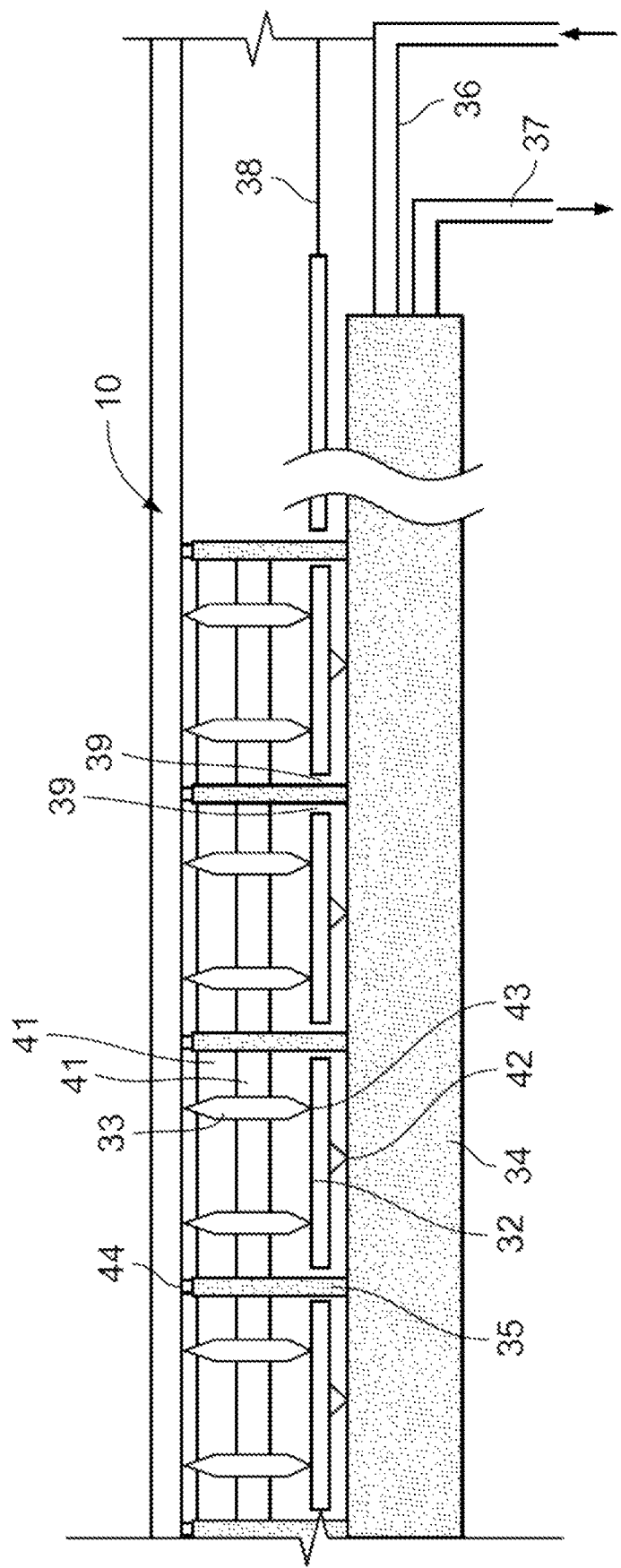
FIG. 5 illustrates the same close up sectional view of the PCB and cold plate shown in FIG. 4 when the springs of the pogo pins are compressed or loaded.

The PCB 32 is positioned directly over the cold plate 34 and is configured for the reception of electricity from external sources 3, 38, as well as signals from a controller, as shown in FIGS. 1, 4 and 5. Ribbon cables may be provided to deliver electricity from external sources 3, 38 to the PCB 32. The PCB 32 is constructed of materials capable of withstanding temperatures expected during the testing of DUTs. When the PCB 32 is positioned for use as part of the system 1, a bottom surface of the PCB 32 includes electrically conductive contacts 42 or pads, such as sponge pads, which connect the PCB 32 to a surface of the cold plate 34, as shown in the cross-sectional view of FIGS. 3, 4 and 5. Such a connection can permit energizing of the test socket (and thereby the DUT(s)) through the cold plate in that the cold plate forms a part of the testing circuit. The inclusion of the cold plate as an electrical path with the PCB permits a smaller PCB with fewer layers since fewer traces are needed to route electricity. Optionally, the electrically conductive contacts 42 may be implemented with any combination of one or more of pins, compliant metal, direct solder etc. In some cases, the cold plate may be formed with ridges, grooves or holes to provide proper compression to ensure contact between the electrical contacts of the bottom of the PCB and electrically conductive portions of the cold plate. In some cases, the contacts 42 may be resiliently compressible pins (e.g., pogo pins) that may extend when no DUT is loaded in the socket and compress when the DUT is loaded in the socket for testing. As illustrated in the example of FIG. 3, the cold plate may include contact grooves 53 to receive the conductive contacts 42. The contact grooves 53 have a depth set for the appropriate compression with the contacts 42.

Slots 39 located on the PCB 32 serve as pockets or cutouts to provide space for extensions 35 originating in the cold plate 34 below to project through the PCB 32 and extend above a top surface of the PCB, as best shown in FIGS. 4 and 5. Included between adjacent extensions 35 are sockets with resiliently compressible pins (e.g., pogo pins 33), as shown in FIGS. 3-5. In a variant, the number and pattern of pogo pins between extensions 35 can be based on a space between slots 39 of the PCB or other considerations, such as those based on the types of DUTs. Pogo pins 33 are spring loaded so that each pogo pin 33 may be compressed when subject to loading (e.g., when DUTs are present in the socket for testing). Each pogo pin 33 sits onto the top surface of the PCB and extends upward in a direction approximately perpendicular to the top surface of the PCB. Optionally, the pogo pins 33 may be joined to the PCB, such as with solder 43. To ensure the pogo pins are secured in place and to ensure proper alignment, socket pieces 41 are provided. A socket may be formed with one or more socket pieces. For example, as shown in FIGS. 4 and 5, the socket 41 has two upper pieces that may be included between pogo pins, where one is above the other. The socket pieces stabilize the pogo pins and ensure desired positioning of the pogo pins including the spacing between neighboring pogo pins and between the pogo pins and the extensions. The socket pieces may be arranged to form multiple discrete sockets with certain sets of pins sitting on the PCB.

It can be seen in FIG. 4 that the pogo pins 33 extend above the extensions 35. FIG. 4 depicts the pogo pins 33 and extensions 35 as they would appear with minimal loading or pressure. Under testing conditions, a top end of each of the pogo pins 33 and extensions 35 will be at approximately the same elevation so that each of the pogo pins 33 and extensions 35 is in contact with contact pads 12, as shown in FIG. 5. This contact allows for the transfer of electricity between the pogo pins and the wafer 10 and the transfer of heat from the wafer 10 to the extensions 35. The alignment of the top ends of each of the pogo pins 33 and extensions 35 is possible because the pogo pins 33 will become compressed in length when elevated pneumatic pressure from the pressure source exerts downward pressure on the wafer 10. In some cases, the PCB may also deflect under testing and loading conditions causing some change in distance between the PCB and cold plate. The resiliently compressible nature of the conductive contacts 42 help to accommodate for such movement to maintain the electrical circuit when including the cold plate within the circuit.

The structure of the system as described provides for transmission of electricity. For example, input electricity travels from the high side of a power source to the leads of the PCB 32. From the traces of the PCB 32 that are coupled to the leads, electricity flows to a first pogo pin 33A as the cathode, into the wafer 10 via contact pad 12, and exits through the adjacent pogo pin 33B. The electricity then flows through the PCB 32 and into the cold plate via the conductive contacts 42 where the cold plate is coupled to a low side (e.g., ground) of the power source to complete the electrical test circuit. Optionally, in some versions, the flow of electricity may be reversed such that the cold plate is the input for electricity from the high side of the power source and the leads of the PCB are coupled to the low side (e.g., ground) of the power source.

The contact between the extensions and pogo pins with the contact pads 12 of the wafer 10, as shown in FIG. 3, provides the necessary contact for operation of the system as described in more detail herein. Moreover, they also provide structural support for the wafer 10 when it is loaded into the system 1. Greater detail about these features of the system is described below as part of the method description.

The system described provides for transfer of electrical power to and heat to or from the wafer. The extensions 35 conduct heat to or away from the wafer. The electrical signals sent to the DUTs can be transferred through pogo pins 33.

Figure 2:
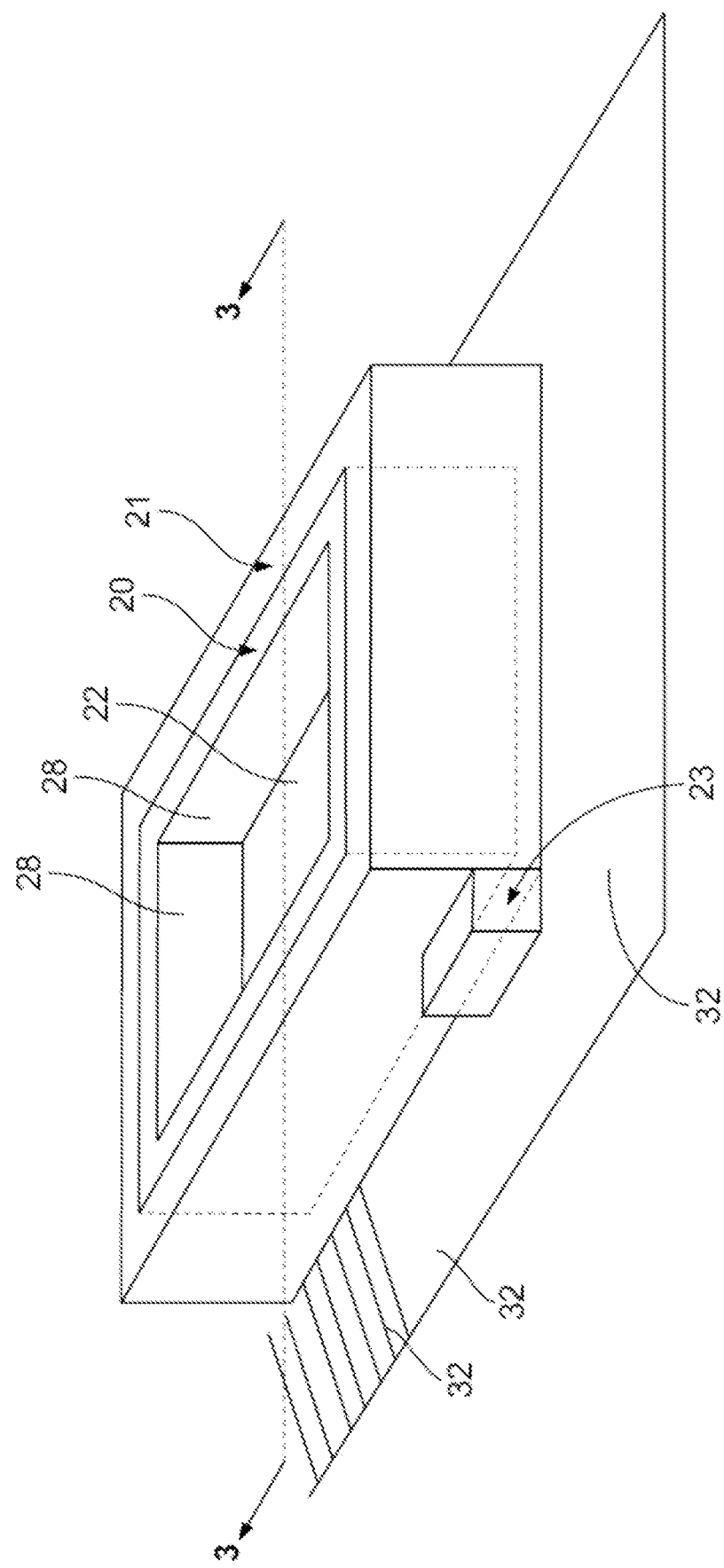
FIG. 2 illustrates a perspective view of the outer housing of FIG. 1 including the seal carrier disposed therein.

An example outer housing 21 of the system 1 can be a rectangular structure with a recessed inner core (shown as rectangular cavity 22), as shown in FIG. 2. The outer housing may optionally be integrated with the lid as discussed in more detail herein. Of course, in variants, the outer housing can be a different shape. A base of the outer housing 21 may include one or more fastening elements (not shown) for securement of the outer housing 21 to the cold plate 34, with the one or more fastening elements being placed through the PCB 32 and into the cold plate 34. The fastening element is contemplated as any of those known to those of skill in the art, such as one or more screws. Optionally, the outer housing in any versions described herein may be liquid cooled. For example, it may include integrated passages for circulating fluid through the outer housing in a similar implementation to the circulation of fluid with respect to the cold plate previously described herein.

The outer housing 21 may optionally also include a securement and alignment mechanism for positioning a tile (e.g., wafer) when inserted into the outer housing 21. The mechanism 23, such as a lever(s) cam(s), pneumatic actuators, which may at least in part be positioned external to the outer housing 21, may reside in one or more protrusions on an inner wall or walls of the outer housing. The mechanism functions to move the wafer 10 to a desired position for testing. For example, the alignment mechanism may be implemented to position the positional-reference features (datums) of the DUT against fixed alignment features in the outer housing, socket, PCB, or cold-plate (e.g., two alignment features in one axis and one alignment feature in a second perpendicular axis one embodiment (not shown in FIG. 2)). The actuators and fixed alignment pins may serve as radial or other bearing surfaces to allow the DUT surfaces to move with respect to these surfaces as it is positioned. This is also described in greater detail in the embodiments below.

Typically, the seal carrier 20 is implemented to hold one or more DUTs during burn-in and testing by creating seal for a pneumatically pressurizable chamber above the DUT(s). The seal carrier may do so by sealing with the tile or wafer on the device side of the tile or wafer. For this purpose, the seal carrier includes a seal as discussed in more detail herein. Optionally, in some versions, the seal carrier may be used to securely transport a wafer 10 such as by holding DUTs between physical locations.

In the version of FIG. 2, the seal carrier 20, as with the outer housing 21, is generally rectangular. Again, as with the outer housing, the shape of the seal carrier can be circular or any other shape. Nevertheless, the shape of its sealing surface may be based on the tile or wafer layout, and a desire to avoid pressurizing the tile beyond the areas supported by the socket and cold plate. This can avoid undesirable bending and/or breaking of the tile due to cantilever loading. The shape of the seal is also affected by the desire to avoid seal contact with DUTs except at acceptable locations of a tile or wafer.

The seal carrier may be of a similar overall depth as the outer housing 21 and it also includes a recessed cavity 22 defined by inner walls 28. The seal carrier 20 is made of a metal material, although in an alternate embodiment, other materials can be used. The seal may be made of a suitable flexible material. Such materials must be suited to withstand the heat and pressure conditions described herein.

In some versions, the seal carrier 20 may be configured to receive the wafer 10 in a recessed cavity. In some cases, the wafer may be carried by the seal carrier for testing. More detail regarding the DUTs and the form in which they are provided for testing is provided below. The recessed cavity of the seal carrier 20 may be shaped to receive the wafer 10 and the wafer can be placed into the seal carrier while the seal carrier 20 is situated outside of the outer housing 21 and the remaining components of the system 1. The seal carrier 20 fits into the recessed inner core of the outer housing 21.

During burn-in and testing, as shown in FIGS. 2 and 3, the seal carrier 20 is disposed entirely within the outer housing 21. After positioning as discussed above, the seal carrier 20 is aligned and secured for purposes of the electrical connection between the PCB 32 and the wafer 10. The wafer 10 in the aligned position can move vertically in response to changes in air pressure within the recessed cavity 22 and may do so together with the seal carrier which can also move vertically within mechanically defined limits. The compliant seal may also move with the tile/wafer. In this regard, the seal carrier may also move to maintain suitable contact with the tile/wafer. Springs may be provided to bias the seal carrier away from the lid, urging the seal of the seal carrier toward the tile or wafer. In the aligned position, the seal carrier 20 is situated above the PCB 32 with some portion of the seal carrier and seal directly above the wafer, as best shown in FIGS. 2 and 3. The seal carrier 20 is positioned over the PCB 32 in a manner that provides an open space between contact pads 12 on a bottom surface of the wafer 10 and the PCB 32, as shown in FIG. 3 for example. The contact pads 12 and the PCB 32 face each other. When serving as a carrier for the wafer, the nesting nature of the design of the seal carrier with respect to the outer housing as shown in FIG. 2 can provide rough alignment of the wafer over the PCB. And while the wafer is positioned in the system 1, its vertical position is not fixed, providing play to maintain contact between the compliant seal and the wafer as pressure is applied and released.

The tile or wafer 10 carries multiple die or integrated circuits for burn-in or testing. Throughout the specification, these die or integrated circuits are referred to as DUTs. In the embodiment as shown in FIG. 1, the die are unsingulated and each includes a plurality of contact pads 12. In one variant, the wafer is ceramic. In another, it is silicon. In another variant, the DUTs are light emitting diodes. In yet another variant, the die can be singulated and placed onto a frame to be placed in the seal carrier. In other variants, each die can include a single contact pad.

To permit the increase in pneumatic pressure within the recessed cavity 22 during burn in and/or testing, a lid 24 is supplied for placement over the recessed cavity 22, as shown in FIGS. 1 and 3. The lid may also seal with the outer housing and/or the seal carrier. The sealing may be dynamic or static. This completes the pressure chamber. The lid 24 includes an inlet valve 26 and an outlet valve 27 for applying or releasing the pneumatic pressure of the chamber. The lid 24 is sized to overlie the seal carrier 20 so that the outer edges of lid 24 are supported by the outer housing 21. The lid may include securing means such as one or more fasteners or screws near a perimeter of the lid (not shown) for securing the lid to the outer housing 21. Alternatively, the lid may be secured by pneumatic locks. In some variants, the lid includes a fan affixed to the exterior to remove heat (e.g., the radiant heat for the DUTs during test) expelled from the DUTs. In other embodiments, the lid can include one or more heat sinks to conduct radiant heat away from the chamber or a liquid-cooled cold plate. Optionally, an inner surface of the lid may include an absorbing coating to absorb electromagnetic radiation (e.g., any one or more of light, infrared and ultra-violet) emitted by a DUT into the lid cooling media and minimize radiant energy reflected back to the DUTs.

Figure 9:
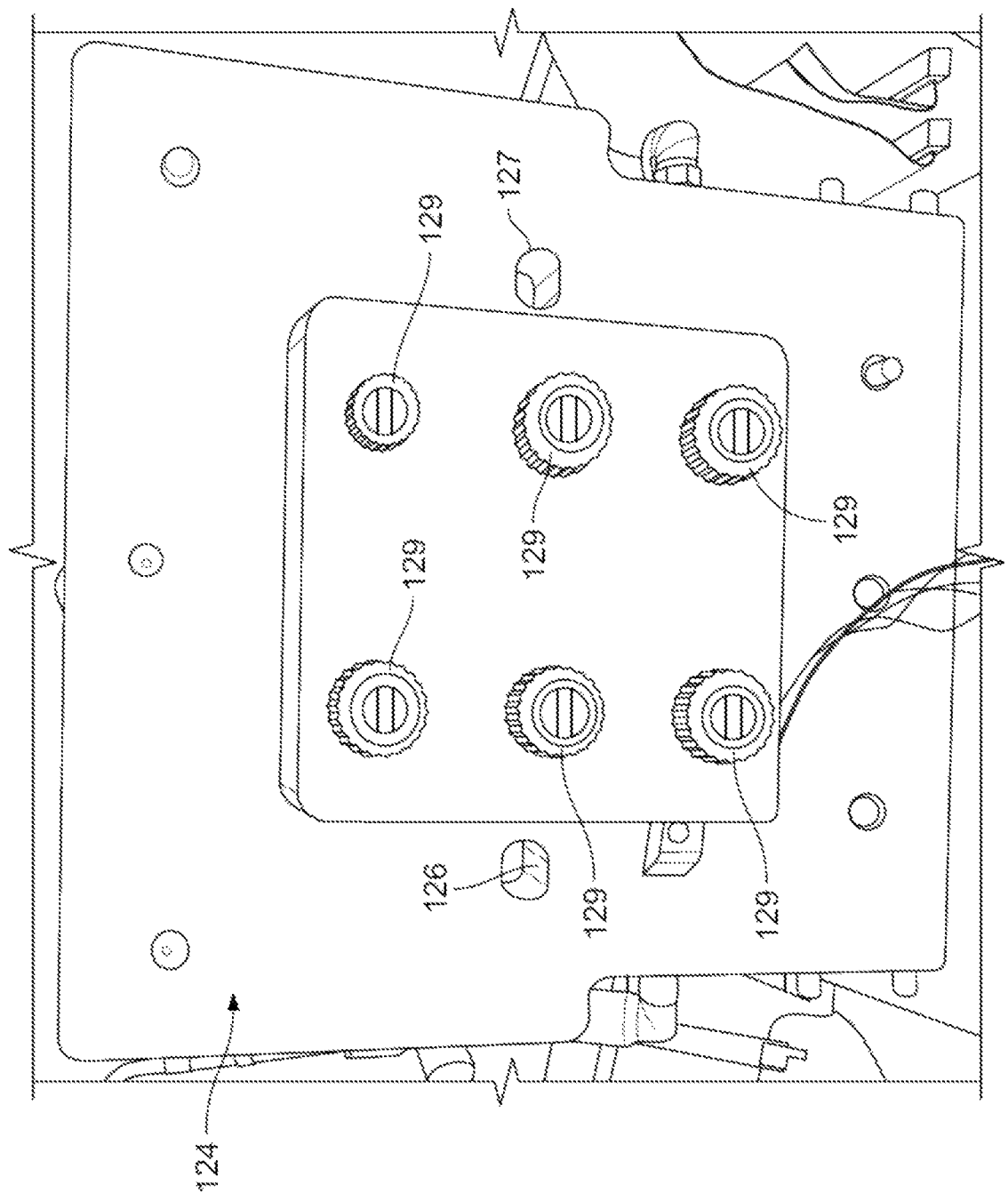
FIG. 9 illustrates the lid of another embodiment as it appears from a surface facing the interior of a recessed cavity within the seal carrier.

In another embodiment, the lid can include sensors 129 such as temperature sensors. For example, infrared sensors may be attached on an inside facing surface of the lid to measure temperature of the DUT(s). In one example, as shown in FIG. 9, six infrared sensors are positioned on the inner surface of the lid 124 in a rectilinear array. In some cases, the lid may include one or more thermocouples, or other temperature sensor, on a compliant mounting that contacts the DUT to sense the DUT temperature. Inlet and outlet valves 126, 127 are positioned outside of the array. In other examples, fewer or greater quantities of sensors can be included in any arrangement of positions on the lid 124. When the lid 124 is closed, a small space may remain between the sensor and the wafer to ensure no contact occurs between the two, if desired. Contact between the sensors and the wafer in some cases can adversely affect the DUTs and the test results.

Figure 6:
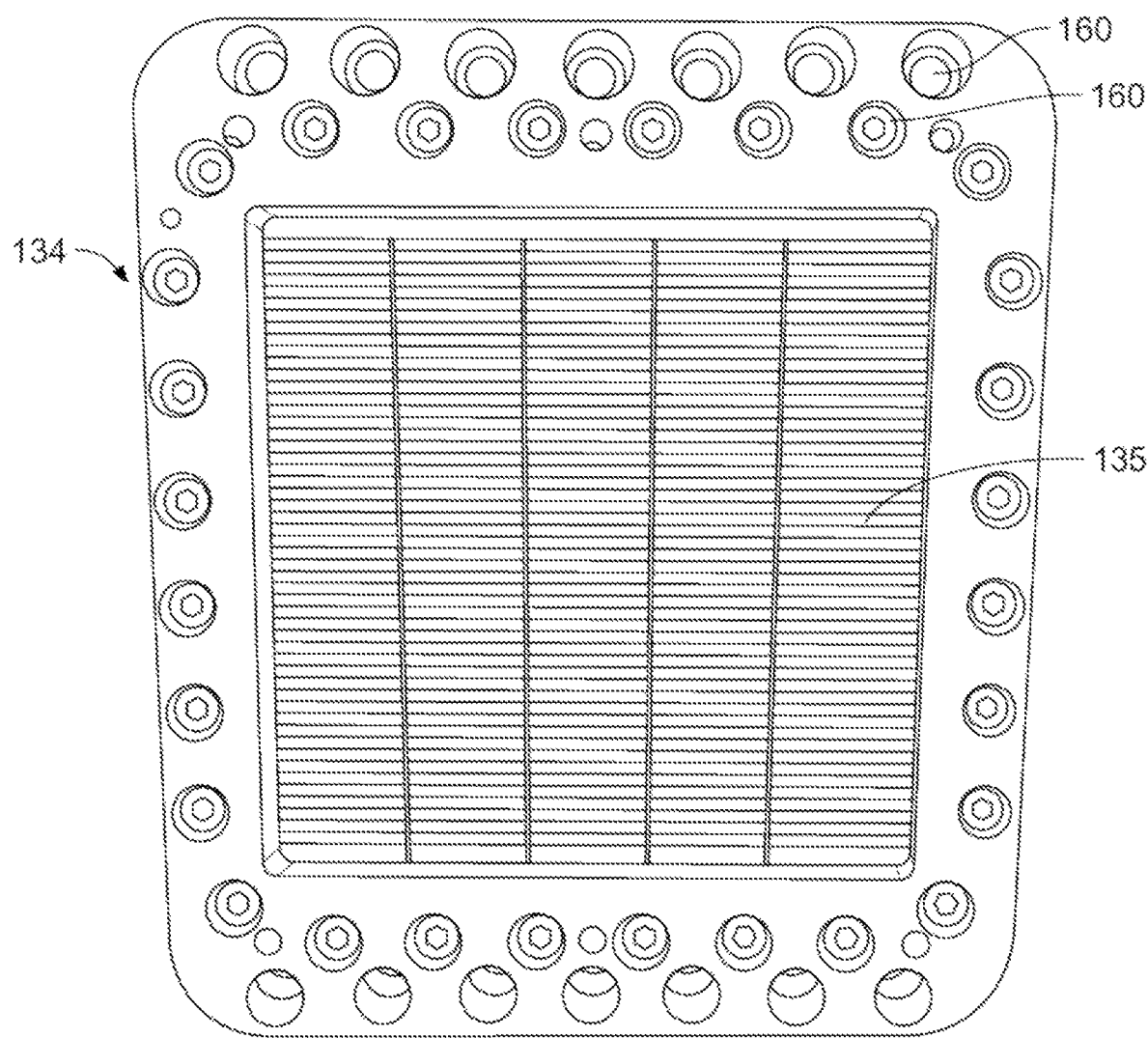
FIG. 6 illustrates a plan view of a cold plate of another embodiment.

In another embodiment, the system 1 described above can include a cold plate 34 having extensions without any TIM disposed thereon. In yet another embodiment, a cold plate 134 is as shown in FIG. 6. The cold plate 134 includes extensions 135 as shown and recesses 160 in a surface of the cold plate to secure the cold plate to a supporting surface. The cold plate may be made of copper. The cold plate may also include bus bar(s) 49 (See FIG. 4) to secure electrical contacts for completing the electrical circuit with the power source as described herein. Optionally, the cold plate may include a deep groove 51 (See FIG. 4), which may be cut into the plate. The groove in the copper may be around a perimeter of the array of extensions 135 so that the array of extensions rise from a stage or platform portion PP of the cold plate surrounded by the groove 51. The space provided by the grove helps to minimize the lateral conduction path from the extensions. It can promote uniform cooling across the entire array and minimize edge effects.

Figure 7:
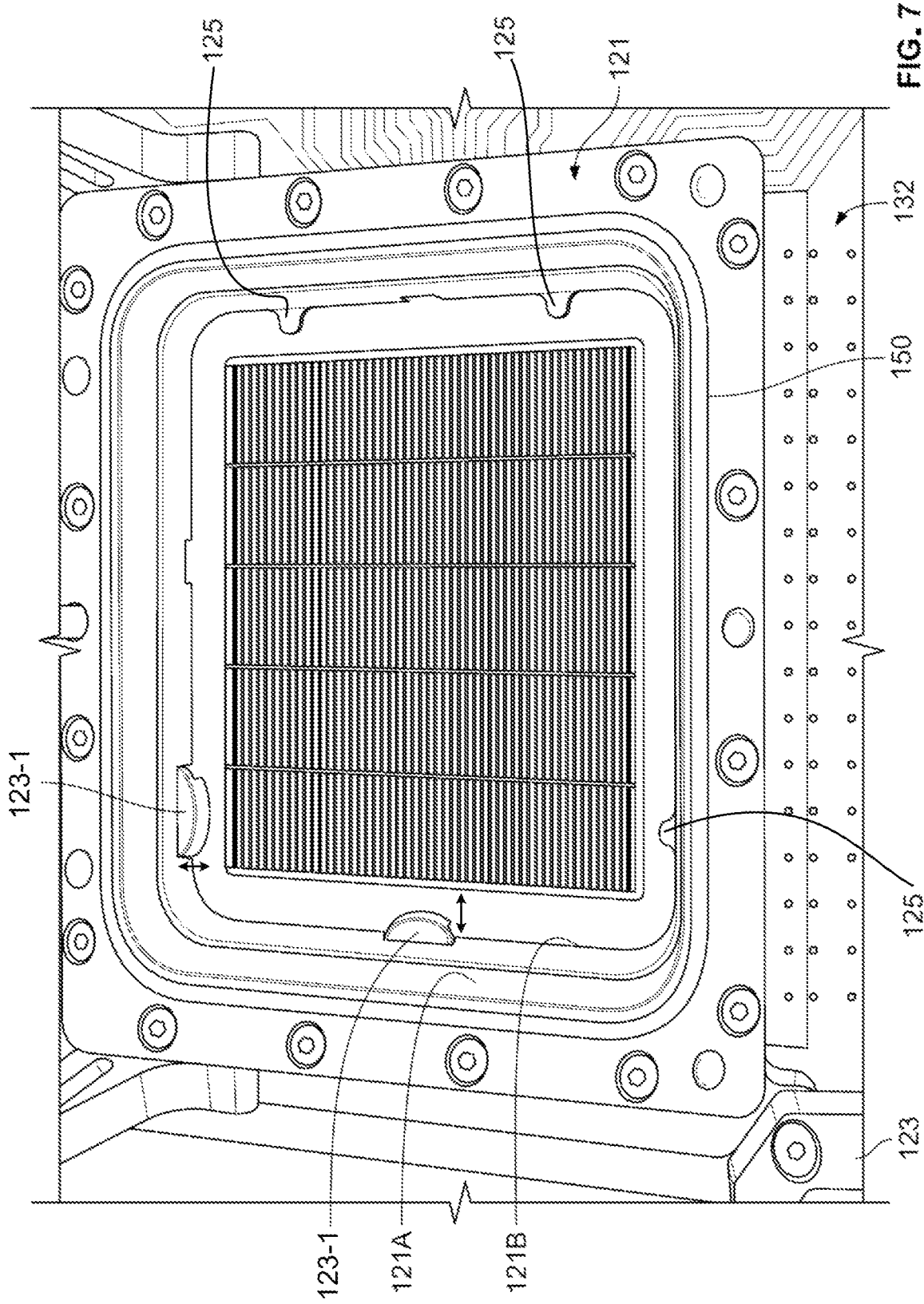
FIG. 7 illustrates a plan view of another embodiment of the outer housing without the seal carrier.

In another example shown in FIG. 7, an outer housing 121 includes two parts, an upper part 121A shaped for connection with a lid from above, and a lower part 121B for securement to the cold plate 34 through the PCB 132. The upper part 121A is secured on top of the lower part 121B while the lower part is secured into position on the PCB 132. The upper part 121A includes an O-ring seal 150 positioned on a perimeter of a hollow core of the outer housing 121 so that it can support a lid placed over the outer housing 121 during testing. The lower part 121B is secured to the cold plate with one or more screws (not shown) extending through the PCB 132. A mechanism 123 is located on the lower part 121B and when actuated in a first manner (see arrows in FIG. 7), mechanically locks a wafer into an aligned configuration by movement of alignment bumpers 123-1. Aligning features 125 serve as stops are within the outer housing. When the mechanism 123 is actuated in a second manner, a wafer in the aligned seal carrier is released to an extent that it is allowed to move freely vertically within the seal carrier when the air pressure in the recessed cavity 22 is increased after the lid 24 is placed thereover forming a sealed chamber in which the wafer carrying the DUTs is imposed. The increase in air pressure exerts a downward force on the wafer as described herein.

Figure 8:
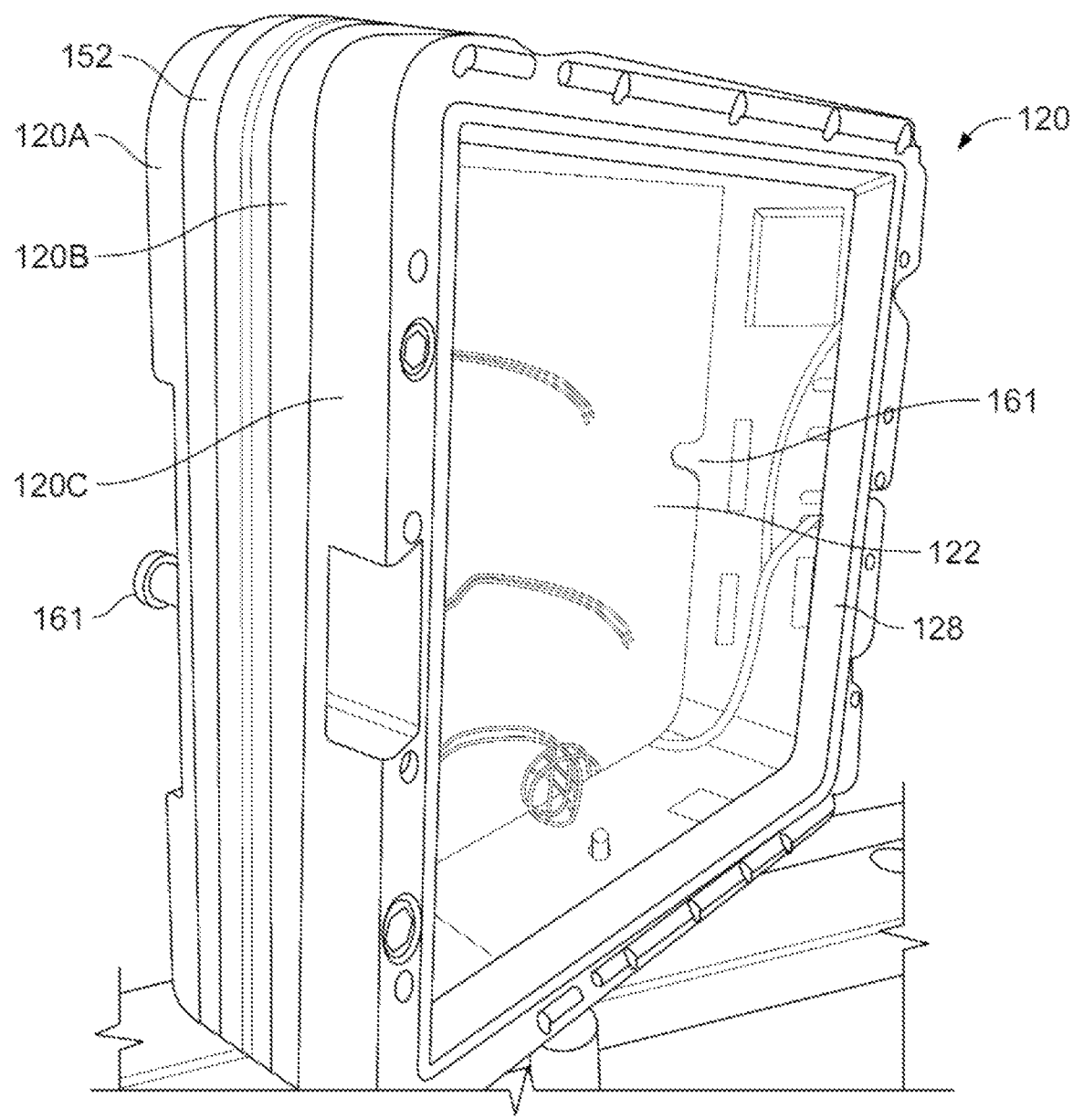
FIG. 8 illustrates a perspective view of another embodiment of the seal carrier.

In another embodiment, the seal carrier 120 includes four components: A top part 120A, a buffer part 120B, a bottom part 120C and a seal 128, as best shown in FIG. 8. Each part defines a hollow core 122. In the illustrated embodiments these components resemble a rectangular ring but other configurations are contemplated. The top part is larger than the other components and includes an o-ring 152 to seal air inside the chamber when it is pressurized. It also includes two ejector pins 161. The buffer part 120B is secured to the top part 120A with linear bearings with fixed travel and is also spring loaded. The spring-loaded characteristic of the buffer part 120B allows it to move relative the top part 120A. The bottom part 120C mechanically fastens to the buffer part 120B clamping in place a compliant seal 128 (or main seal). Optionally in some versions, the bottom part 120C may comprise a portion of a magnetic holder for retaining the wafer, throughout an inner perimeter of the bottom part where the inner perimeter is sized to allow for the secure placement of the wafer within its bounds. When the wafer is placed inside, it fits snugly against the seal 128. The assembly, particularly with the compliant seal, provides an airtight fit of the wafer within the bottom part 120C since the seal will move up and down (i.e., vertically) with the tile/wafer when in the test socket. The combined components of the seal carrier 120 of this embodiment are compatible with the alignment mechanism as described above that secures and aligns the wafer relative to the cold plate and PCB.

In yet another embodiment, the mechanisms for aligning the seal carrier 120 and the wafer when placed inside the outer housing 21 are automated. In other embodiments, a manual method of securing and aligning the seal carrier can involve one actuating step to bring the seal carrier into alignment and prepared for use in testing. In another embodiment, the lid can comprise a cold plate structure as described herein. Because a cold plate includes mechanisms for cooling, a lid of this type would not require a fan or a heat sink. In still other embodiments, the PCB can include multiple ground layers to provide reduced thermal resistance.

The above embodiments have described DUTs carried by a wafer. DUTs can be provided in a variety of formats (singulated or unsingulated). As used herein, wafers can also be tiles or substrates or any conventional structures that carry devices to be tested using the apparatus described.

Through the arrangement of the system as described herein, the system facilitates high rates of transfer of thermal energy with low thermal resistance during burn-in testing and in other forms of performance testing. In addition, the transfer of signals measuring conditions of a DUT and electricity are successfully and reliably obtained.

In another aspect, the system is constructed through a method of assembly. First, the cold plate is positioned at a location where the system is desired to be used. Second, a PCB is placed over the cold plate so that the grooves in the PCB receive the extensions of the cold plate that extend therethrough. The PCB is connected to the cold plate through the conductive contacts (e.g., contact pads). When the PCB is in place, the pogo pins are placed onto the PCB. The pins may be placed simultaneously with the socket, such as when the pins are installed in the sockets. The sockets are placed to space out and otherwise align the pogo pins. The outer housing may then be fastened into place over the PCB and socket. The outer housing is positioned accurately over the test area having the pogo pins and extensions of the cold plate using locating features that define the positional reference between the cold plate, PCB, socket and outer housing. With all external electrical connections in place and other external devices also in place, such as the heat exchanger, the system is ready for use. The wafer is then placed into the test area using the seal carrier or another method. The wafer may be aligned using the alignment mechanism (23), and the moving seal carrier and lid are positioned and locked over the wafer. Pressure may be applied to create simultaneous electrical and thermal contact of the wafer contact pads (12) with the thermal extensions (35) and the pogo pins (33) as described in other parts of the specification.

In yet another aspect, the system is used in a method of conducting burn-in and testing of ICs, such tested ICs being referred to as DUTs. In one embodiment of the method, the wafer 10 is positioned and oriented within the seal carrier 20 so that the contact pads 12 face downward, away from the lid interfacing side of the seal carrier. Separately, an outer housing 21 is positioned on top of and secured to the cold plate 34 through the PCB 32, as shown in FIG. 3. The seal carrier 20 with wafer disposed therein is then transported to the outer housing 21 and disposed therein. The outer housing has a recessed inner portion sized so that the seal carrier fits securely within inner walls of the outer housing when placed therein from above. Because the contact pads 12 on the wafer within the carrier are oriented in a downward direction, each faces the PCB 32 when the seal carrier 20 is disposed in the outer housing 21. When the seal carrier is first placed within the outer housing, it is floating and unsecured and the wafer is roughly positioned relative to the test jig. Using the alignment mechanism 23, the wafer is aligned to the test jig. This may be achieved by actuating the alignment mechanism in a first manner. Optionally, the seal carrier is secured to the outer housing using a securing means. Alternatively, as previously discussed, the seal carrier may be secured to the outer housing by securing the lid over the seal carrier with locking actuators. Then, the alignment mechanism may be actuated again to permit the wafer within the seal carrier to move freely vertically in a direction perpendicular to a surface of the PCB 32. At this juncture, the lid is secured and the wafer is aligned with the lid in the horizontal plane. The wafer and seal carrier are moveable within limits in the vertical plane when subject to load, such as that from air pressure. In its position within the seal carrier 20 for testing, the wafer 10 is positioned above the PCB 32 and is supported by the pogo pins 33 which extend upward from the PCB 32. In an unloaded position, the wafer is only in contact with the pogo pins as the pogo pin springs have not been depressed due to loading to bring them down to the same level as the extensions 35.

When the above elements are assembled, the lid 24 is placed over the outer housing 21 and seal carrier 20, closing the recessed cavity 22, as shown in FIGS. 1 and 3, for example. The lid 24 seals the recessed cavity 22 forming a chamber and is secured to the outer housing. In one variant, rotatable fasteners are used to secure the lid to the outer housing and an o-ring around the inner perimeter of the outer housing provides the airtight seal between the lid and the recessed cavity. Once the recessed cavity is properly sealed, compressed air is pumped into the recessed cavity through the inlet valve 26 to create positive air pressure in the recessed cavity 22. Positive pressure in the chamber formed by the sealed recessed cavity is increased to an amount in the range of about 20 psi to about 100 psi for testing. In one variant of this embodiment, positive air pressure in the chamber is increased to about 95 psi prior to commencing burn-in or testing. Using about 95 psi as a pressure in the chamber has the advantage of being compatible with a capacity available at a majority of testing facilities. Also, the wafer, tile or substrate may be susceptible to breakage at higher pressures (e.g., pressure well in excess of about 95 psi as an example) if subject to such pressures. It is also noted that thermal resistance between the contact surfaces of the wafer and the extensions 35 decreases with the increasing pressure provided by the chamber to urge the wafer in contact with the extensions. Thus, removal of thermal energy from the DUTs is accomplished with smaller temperature difference with improved contact. However, as noted above, pressures that might be optimal for thermal contact may increase the risk of damaging wafers. Thus, other solutions that increase thermal conductivity in the system and thus improve the heat transfer without requiring pressures in excess of 95 psi may be implemented without a concomitant increase in pressure. For example, by including TIM at the tips of the extensions 35 of the cold plate, thermal conductivity is improved. Thus, thermal contact resistance that would otherwise require air pressure in excess of 95 psi can be achieved at lower pressures with the inclusion of TIM. In this variant, TIM is included at the tips of each of the extensions 35.

As previously noted, the applied air pressure of the pressure chamber creates downward force inside the recessed cavity 22 onto the wafer 10, and in turn, forces the wafer to compress the pogo pins 33 underneath the wafer, and further forces the PCB under the pins to compress the contacts/pins under the PCB. For example, when the wafer 10 first makes contact with the pogo pins 33, the system appears as shown in FIG. 4. Because the pogo pins are spring loaded, the increased chamber pressure urges the wafer to depress the pogo pins as the wafer moves lower inside the recessed cavity. As this occurs the contact force between the pogo pins 33 and the wafer contact pads 12 increases. This continues until contact occurs between the contact pads 12 of the wafer 10 and the cold plate extensions 35. Further increasing the chamber pressure increases the contact force between the contact pads 12 and the cold plate extensions 35, but the contact force between the pogo pins and contact pads remains essentially constant. The outlet valve 27 on the lid 24 permits regulation of the input pneumatic pressure so that any excessive gas pressure buildup in the recessed cavity or pressure chamber can be expelled through the outlet valve 27. In some cases, a pressure regulator may be implemented at the inlet side, and the outlet side may be used merely for releasing/removing gas pressure after the test is complete. This ensures that the force between the contact pads 12 and the cold-plate extensions 35 remains in the desired range and the pogo pins 33 remain compressed during testing without any relative movement. It also minimizes the risk that any components will be damaged. When the intended pneumatic pressure is reached, the pogo pins 33 are depressed to an extent that a top end of the pogo pins is at the same elevation as a top end of the extensions 35 of the cold plate, as shown in FIG. 5. In this way, the wafer is now in contact with the pogo pins 33 and the extensions 35 under the operational positive pressure. In some cases, the pogo pins may be fully compressed before the desired pneumatic pressure is reached. The total downward force on the tile is balanced by the sum of the upward force from the pogo-pins/socket and the cold plate extensions (35). Thus, to create adequate contact pressure on extensions 35, the total downward force should be appreciably greater than the force required to simply compress the pogo pins. In other words, the portion of the pneumatic force that exceeds the force to compress the pogo pins creates the contact force between the wafer and the extensions.

To commence testing, an electrical source of the system is activated, sending electricity via electrical signal lines to the PCB 32. Electricity received in the PCB 32 travels through pogo pins 33A that operate as an anode and then into the wafer 10. The ground, or cathode, in this system includes pogo pins 33B, through-hole vias in the PCB 32, and ground contacts 42 between the PCB and the cold plate. When energy is dissipated from the pogo pins 33B, it travels through the pogo pin, PCB and conductive contact 42 into the cold plate. When thermal energy is transferred through the extensions 35, it travels directly into the cold plate. Thus, the system conducts a large amount of heat away from the wafer/DUTs during its operation. The embodiment of the system as described can have a heat dissipation capacity of up to 100 Watts/cm$^2$ (>200 W/cm$^2$ at the thermal contact pads). However, systems with different heat dissipation capacities can be achieved by the skilled person. In one example of the described embodiment where the wafer is 100 mm×100 mm in dimensions, the system safely and successfully operates when the power through the system is 5 kW.

During burn-in testing substantial heat can be generated in the DUTs due to the electricity running through the system and into the DUT. In some cases, the heat generation, devices and the test are run essentially at steady state conditions. In some versions, when the temperature of a DUT exceeds the range or value designated for burn-in testing purposes, a temperature sensor, such a sensing pin in contact the DUT, may optionally communicate with the temperature controller and computer through the PCB for implementing temperature controller. The PCB may optionally be configured to serve as the means for communication of such temperature sensor signals from the DUTs in addition to the electricity received by the DUTs.

Optionally, in receipt of the temperature data, the computer may control an adjustment to the temperature setting based on programmed preferences and communicates with the controller to adjust the operation of the cold plate to bring the temperature of the DUTs within the desired tolerances or optionally to switch off electricity and thereby stop the test. For example, the cold plate conditions may be controlled electronically to maintain the temperature of the DUTs within a tolerance band around the desired test temperature. If sensors detect the temperatures are outside of this range the test can be aborted. In general, the controller continually adjusts various actuators that control the cold-plate operating conditions in response to the measured temperatures to minimize the error (e.g., a feedback temperature control loop) between the measured and set temperatures. In some versions, a temperature controller and electronics controllers may be separate and communicate with each other and with a programmable logic controller for the chamber.

As mentioned above, heat dissipated by the DUTs is transferred into the cold plate during testing. Inside the cold plate itself, fluid flows through small cavities (not shown) to remove heat from the cold plate. Thus, as the fluid flowing through the cavities is heated by thermal energy received in the cold plate from the DUTs, it is removed from the cold plate via outlet 37. As shown in FIG. 1, the heated fluid passes through a heat exchanger 73 and once cooled, is circulated back into the cold plate via inlet 36 to repeat the process. Such heat transfer mechanisms are well known to one skilled in the art and are not described in detail herein. In a variant, the coupling fluid used in the heat exchanger can also be used to cool the electricity supply unit/electronics cabinet of the assembly 70. The fluid in the cold plate can be water, brine, refrigerant, or any other another working fluid or mixture. Additionally, the fluid can be liquid, vapor or two-phase, and the heat exchanger can be a condenser. Both the temperature monitoring of the DUT and the cold plate contribute to ensuring that the DUT stays within a desired temperature range throughout the burn-in test cycle.

Once a testing cycle is complete, each DUT that failed the burn-in test is specifically identified and mapped by the computer. The results are then used to discard the failed devices. Of course, the computer can sort the results as desired to isolate groups of DUTs based on any available criteria such as particular types of features or particular performance thresholds.

In another embodiment, no TIMs are included on the tips of the extensions. In yet other embodiments, the cold plate can be heated via the heating source 80 as shown in FIG. 1. In any one of the above embodiments, automated methods can be used to load and align a wafer into the test area and dispose the seal carrier and lid to the necessary position relative to the wafer to apply the contact pressure. In any one of the above embodiments, a tile or substrate can substitute for a wafer.

One advantage of the above method is that it provides a system that facilitates testing in a single batch (in one cycle) all DUTs on the wafer and does not require two or more testing sessions. This is an improvement over existing systems, which often require the implementation of testing programs where multiple smaller batches of DUTs are tested to avoid problems due to limited heat-transfer capacity and limited pin density. This advantage is partly the result of placing the cold plate below the PCB/socket and passing cold-plate extensions through the PCB, which allows much higher pin density and higher heat flux than is possible if the PCB is below the cold plate and the electrical contacts pass through the cold plate. In the latter configuration, the space required to create a fluid seal around the electrical pins limits pin density and fluid flow passage configurations. Because a burn-in test session can last a significant amount of time, in many cases, in the range of six hours, each additional test that must be performed introduces a significant delay in the process of getting a batch of ICs ready for distribution and use. Also, the single-batch system and method described minimizes the risk of faulty results or other errors that are inherent with multiple-batch testing methods. As an example, if two batch tests are required, the second batch test will invariably subject some of the previously tested ICs to heat or other testing conditions that can alter their material properties. This creates the possibility, if not likelihood, that the results for the ICs tested in the first batch will be distorted. A single batch test avoids such limitations.

Another advantage of the system is that the tray is configured to receive unsingulated or singulated dice of a wafer and in either configuration, burn-in testing can be completed in a single cycle.

Figure 10:
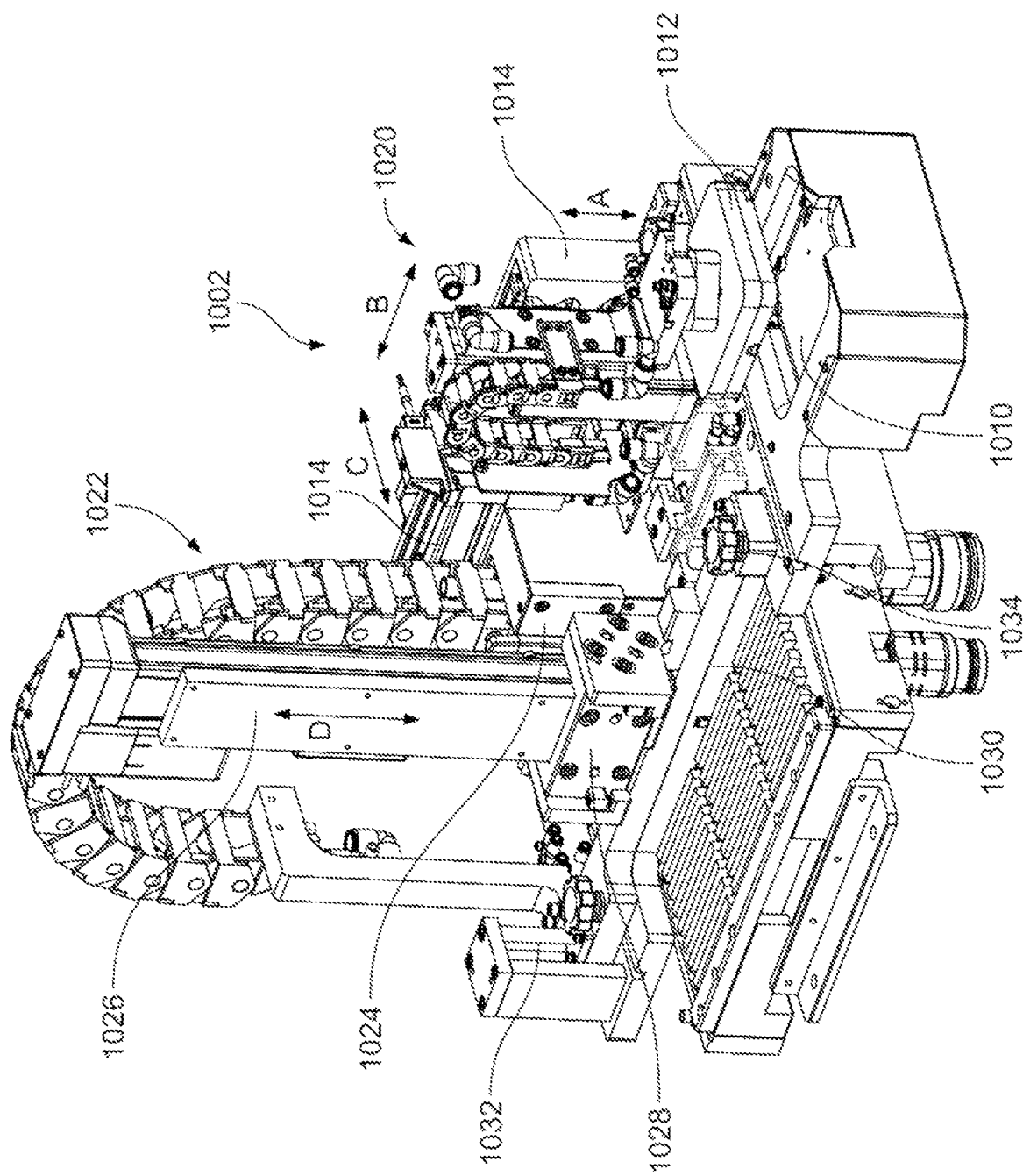
FIG. 10 is a perspective illustration of an automated version of the burn-in system implemented with a robotic pick and place device for moving wafers/tiles to and/or from a burn-in testing location of an automated burn-in system.

In some versions, the features of the aforementioned apparatus may be implemented in automated systems for burn-in testing. Components of such a burn-in system 1002 may be considered in reference to FIGS. 10 to 19. As illustrated in FIG. 10, a tile/wafer receptacle 1010 provides a temporary holding bin for placement of tiles/wafer before and after burn-in testing. The receptacle 1010 can be an extension of the outer house such that it may be an integrated portion or it may be a separate part located near or coupled to the outer housing. A carrier apparatus 1020 serves as an automated carrier for moving tiles/wafers from the receptacle to the socket of the outer housing. It may also serve as an automated carrier for moving tiles from the socket of the outer housing to the receptacle. The carrier apparatus may be a multiple axis pick and place robot having a motorized or pneumatic stage for each axis of movement. For example, the robot may be a three-axis robot (shown as axis A, axis B and axis C). The carrier apparatus is mounted to, and moves along, a carrier rail 1014 proximate to the socket. The carrier rail may include a motorized screw for movement of the carrier along the B axis. The carrier apparatus may include a vacuum chuck 1012 for engaging/holding a tile or wafer by suction. Thus, it may be pneumatically coupled to a vacuum generator (not shown). In some cases, the robot may be a two-axis robot or other articulating robot that is suitable for moving the tiles/wafer into the desired location(s). In some cases, the pick and place robot may be integrated with the outer housing. However, in other versions, a pick and place robot may be implemented to move between multiple outer housings so as to supply and/or remove tiles to/from different test sockets in different locations.

The burn-in system 1002 also includes an automated lid assembly 1024. The lid assembly 1024 incorporates features of the seal carrier and the lid previously described and as described in more detail in reference to FIG. 11. The lid assembly 1024 is arranged with a lifting stage 1022, which may operate on at least one axis (axis D) such as with a motor driven screw (not shown) or pneumatic piston. Thus, the lift can raise and lower the lid assembly for accessing the socket of the outer housing. The lid assembly 1024 moves along rail 1026 such as in a groove or track (not shown) of the rail 1026. The rail includes a rail coupler 1028 for mounting the rail proximate to the outer housing. The range of motion of the lift permits the carrier to traverse under the lid assembly for insertion/removal of DUTs of the socket while the lid assembly is raised above the socket. The external housing includes locking mechanisms 1147 (e.g., pneumatic actuators) to lock the lid assembly into its closed testing position for burn-in testing.

Although the lift may be mounted proximate to the external housing and the socket, the lift may be mounted on a service stage 1030. The service stage 1030, with the lift and lid assembly, may be moved laterally and/or rotated away from the test socket to permit service of the test socket. In the example of FIG. 10, the service stage's movement with respect to the external housing and test socket may be coordinated with a linear/radial bearing 1032 and alignment pin 1034.

Figure 11:
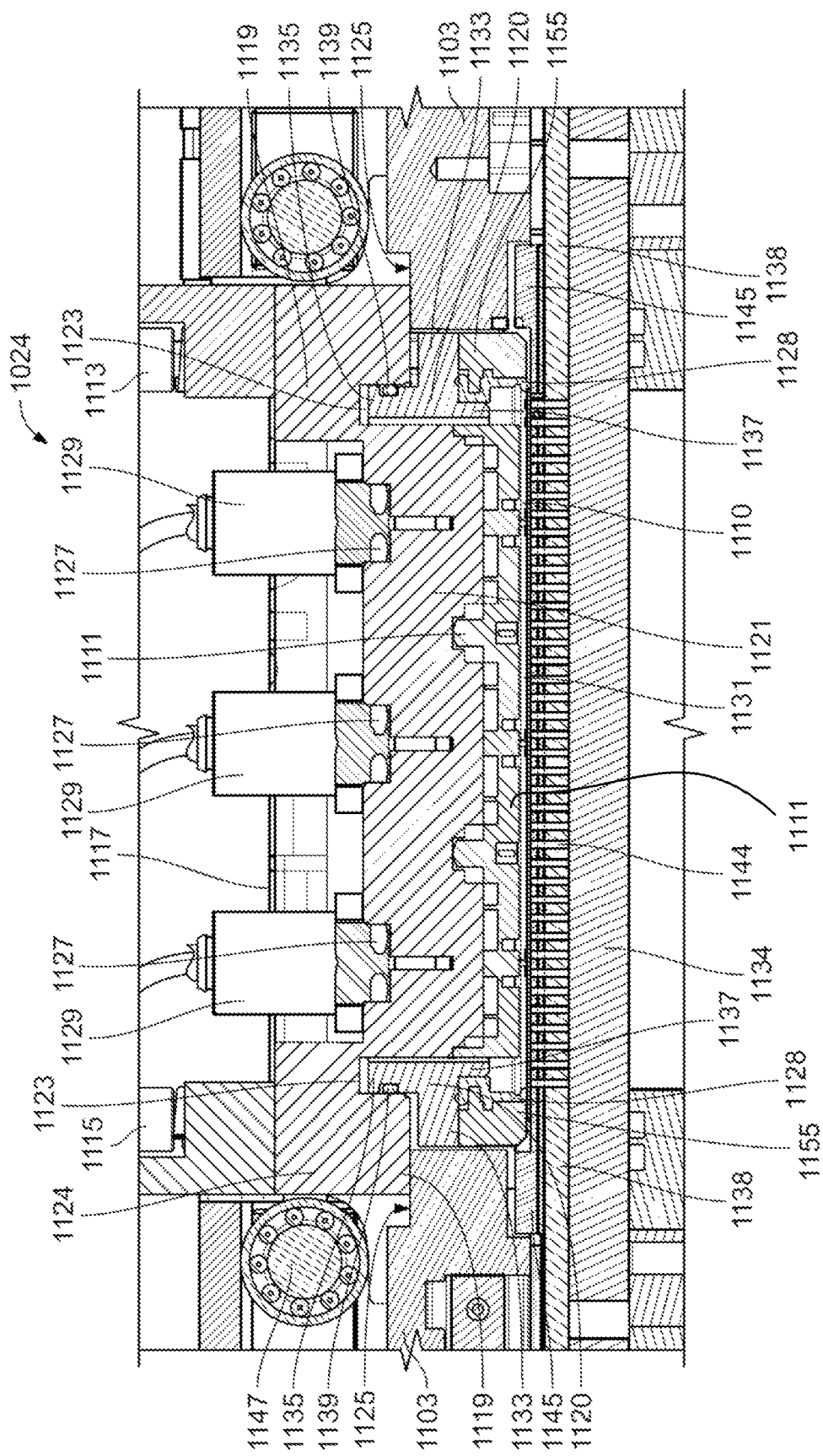
FIG. 11 is a side cross sectional illustration of a version of the burn-in system having an automated lid apparatus, including a seal, and may optionally be implemented as a cold plate, taken along line A-A shown in FIG. 14.
Figure 13:
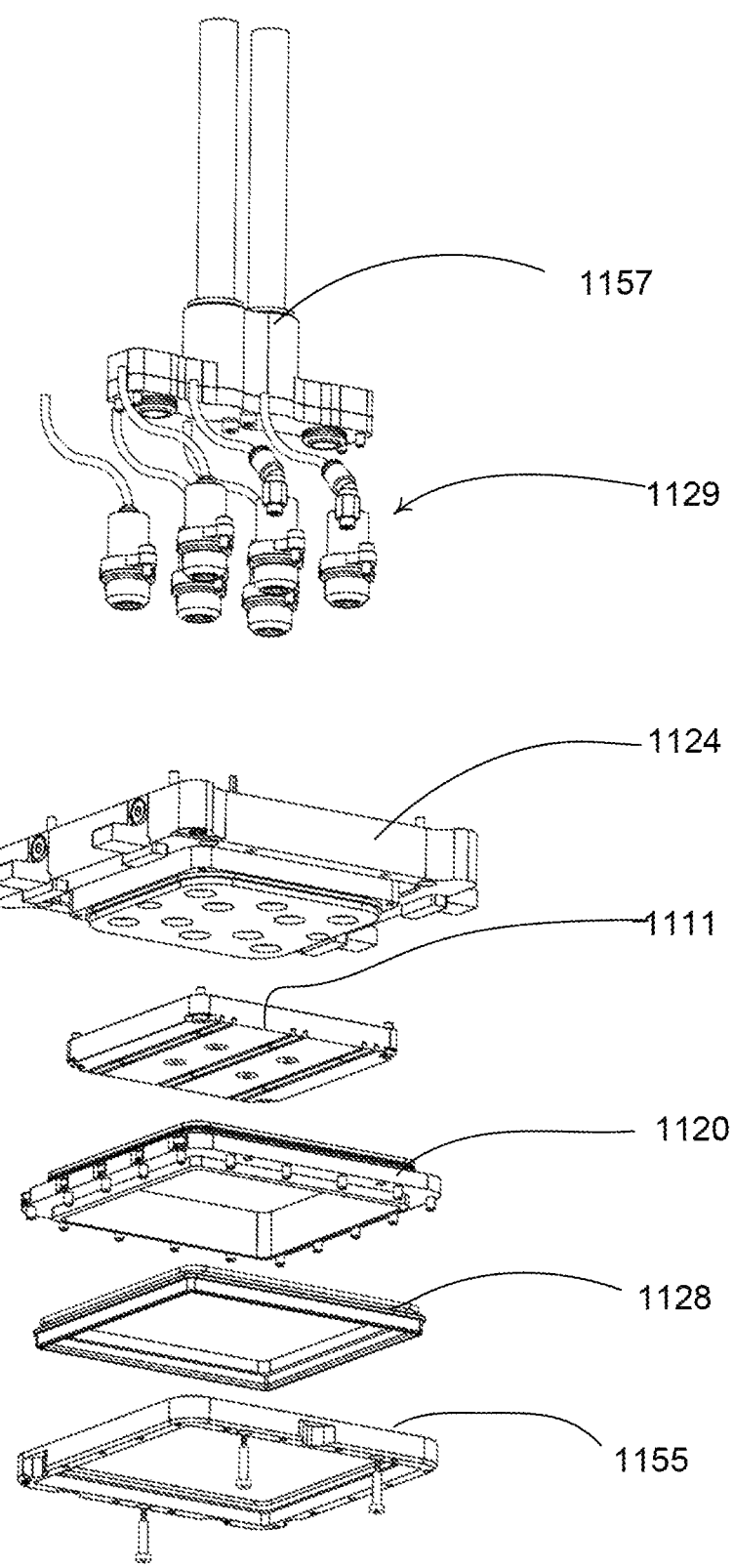
FIG. 13 is a bottom perspective illustration of components of a lid assembly in some versions of the present technology.
Figure 14:
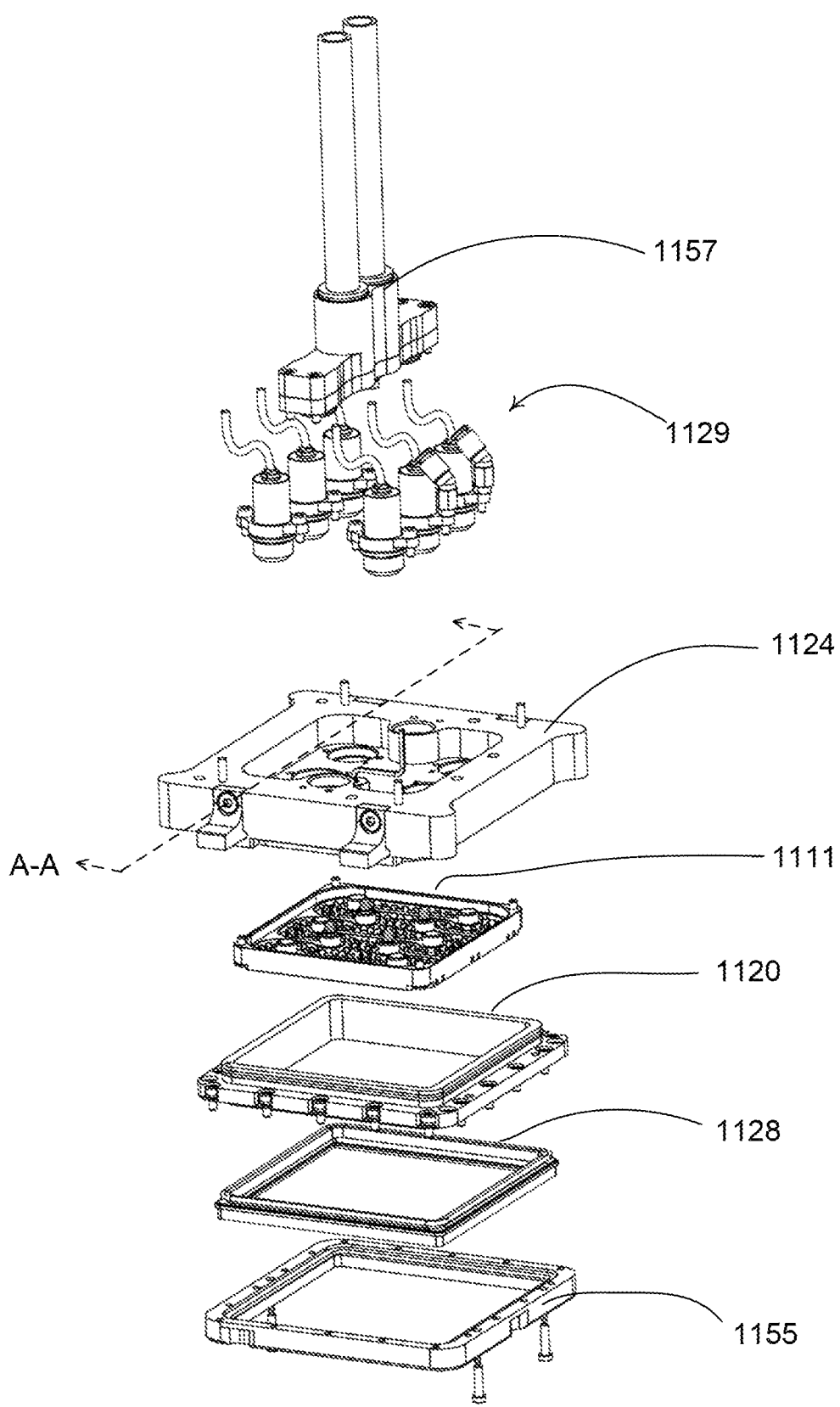
FIG. 14 is a top perspective illustration of the components of the lid assembly of FIG. 13.
Figure 15B:
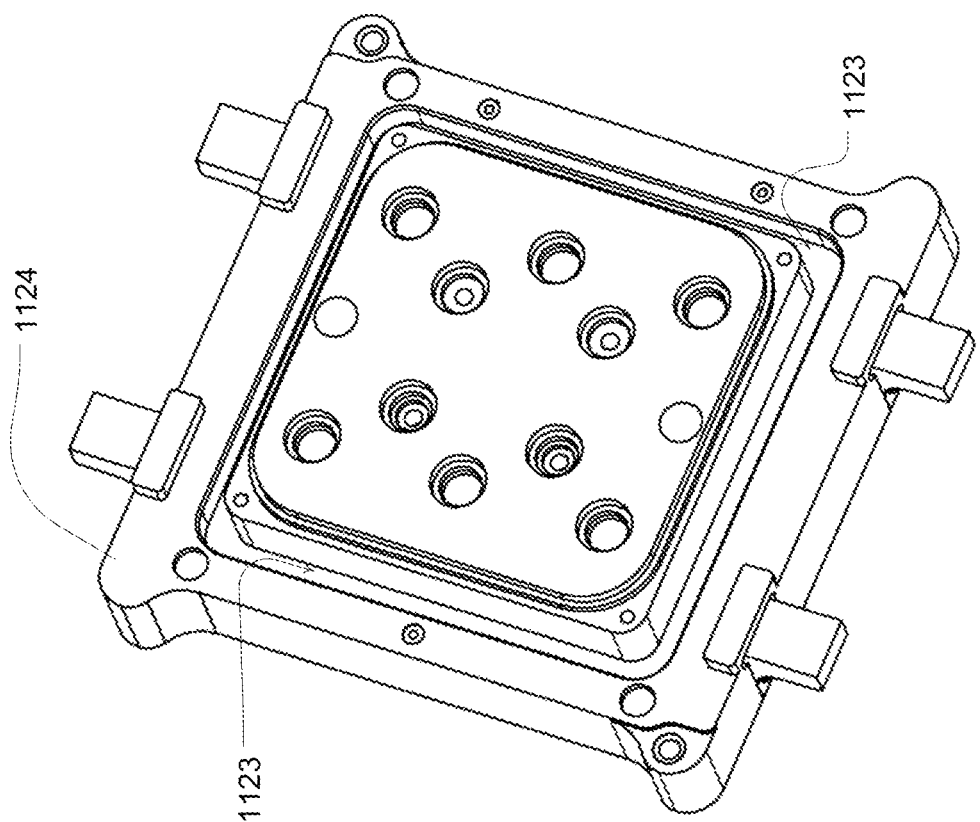
FIGS. 15A and 15B respectively show top and bottom perspective views of an example lid of the lid assembly of FIG. 13.
Figure 15A:
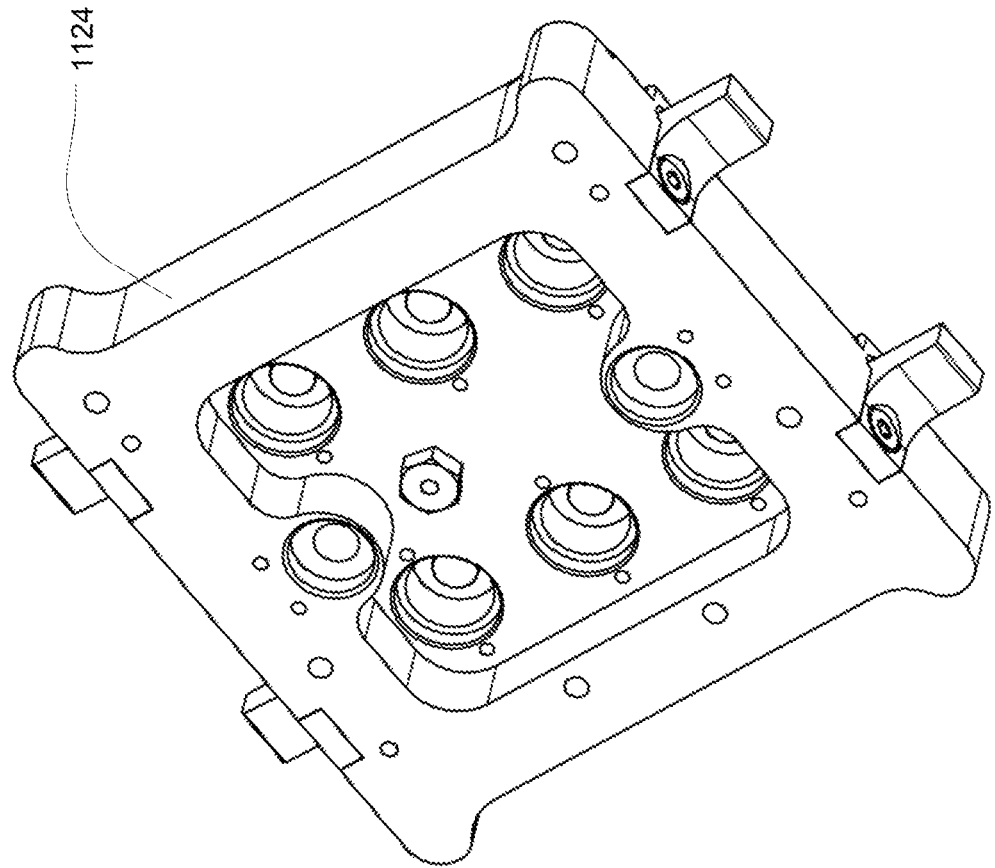

The lid assembly 1024 and its components may be considered in relation to the central cross sectional illustration of FIG. 11 as well as FIGS. 13 to 19. As previously described, the lid 1124 includes sensors 1129. The lid 1124 is moveably coupled with the seal carrier 1120. The lid includes a lid cold plate 1111 at one surface. As previously described, this lid is a manifold that includes fluid channels to circulate a fluid from a fluid inlet 1113 to a fluid outlet 1115. As shown in FIGS. 13 and 14, a manifold assembly 1157 may couple with the include lid 1124 for directing fluid into and out of the lid. The sensors 1129 may be mounted with the lid using o-ring seals 1127 to prevent fluid leak from the channels of the lid and/or pressure leak from the pressure chamber. The lid also includes a pneumatic inlet and outlet (not shown) for pressurizing the pressure chamber formed by the lid and seal carrier over the test socket as previously described.

Figure 16B:
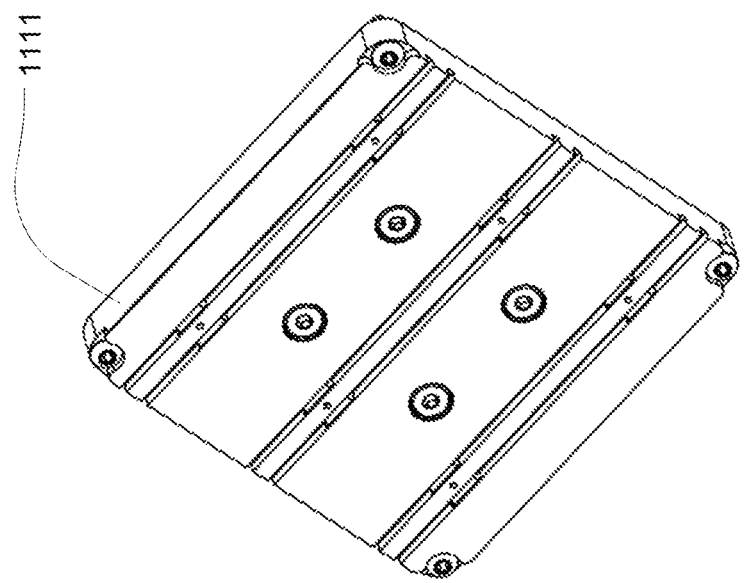
FIGS. 16A and 16B respectively show top and bottom perspective views of an example lid cold plate of the lid assembly of FIG. 13.
Figure 16A:
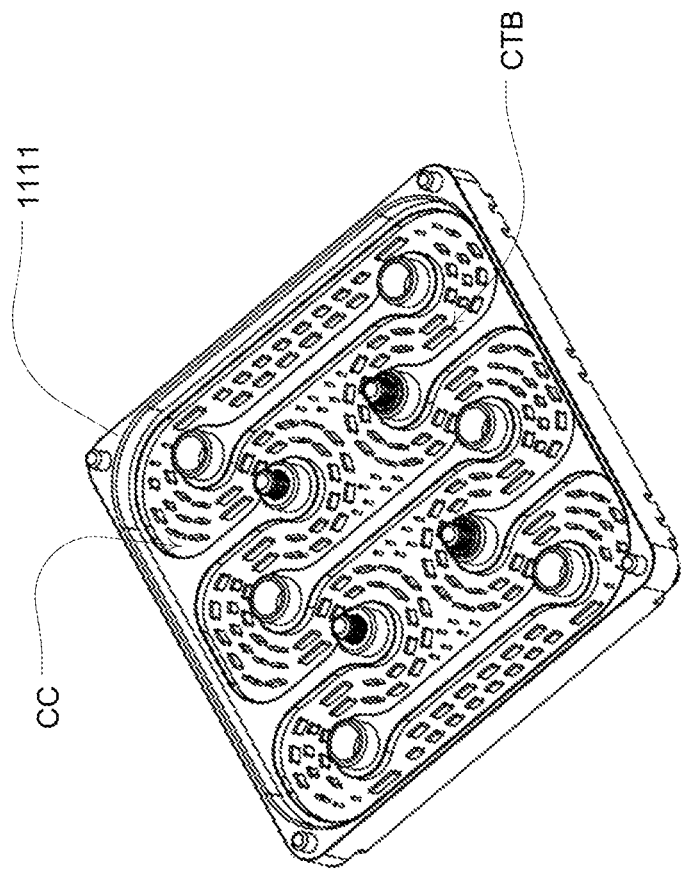
Figure 17B:
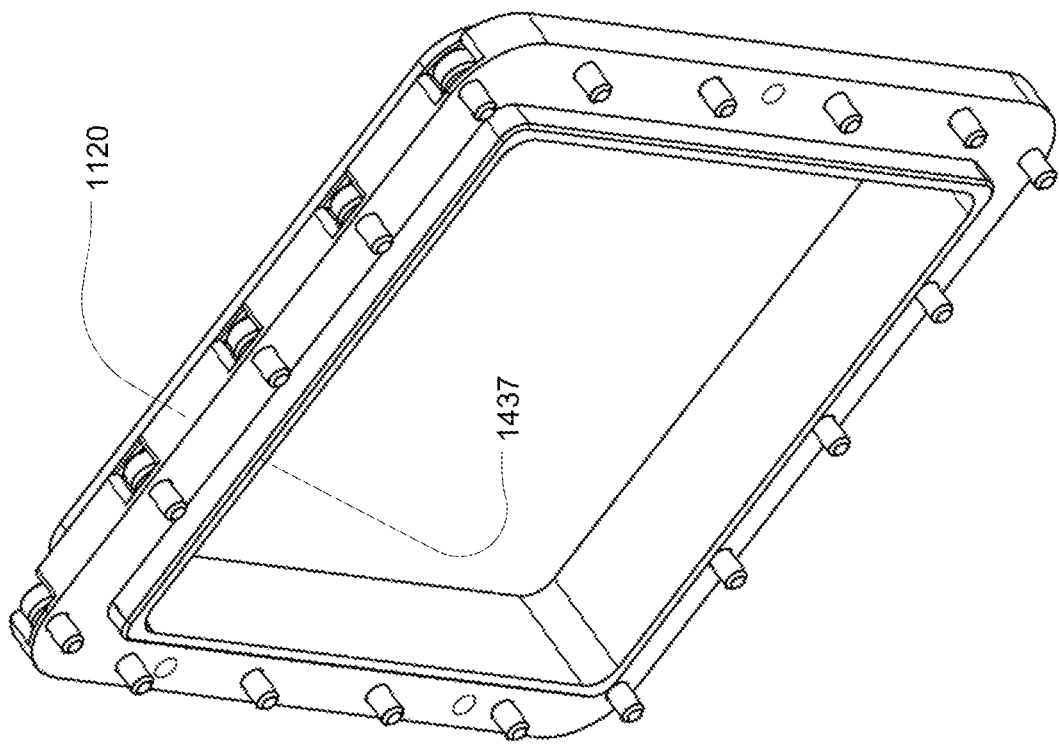
FIGS. 17A and 17B respectively show top and bottom perspective views of an example seal carrier of the lid assembly of FIG. 13.
Figure 17A:
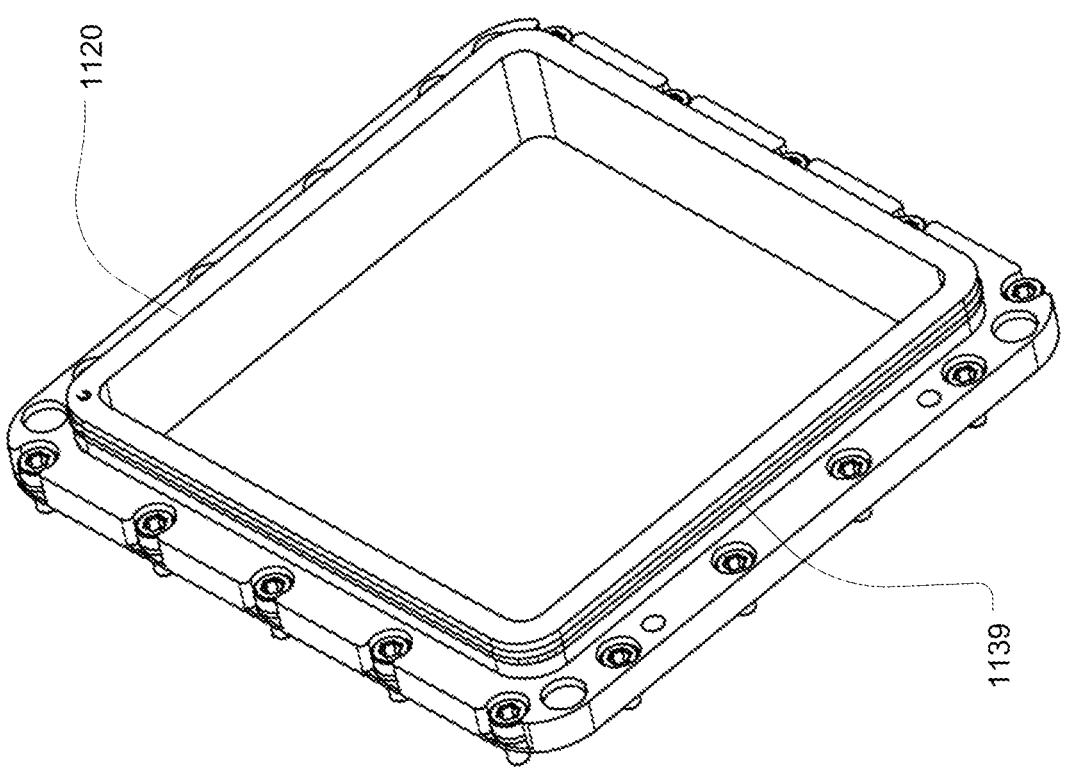
Figure 18B:
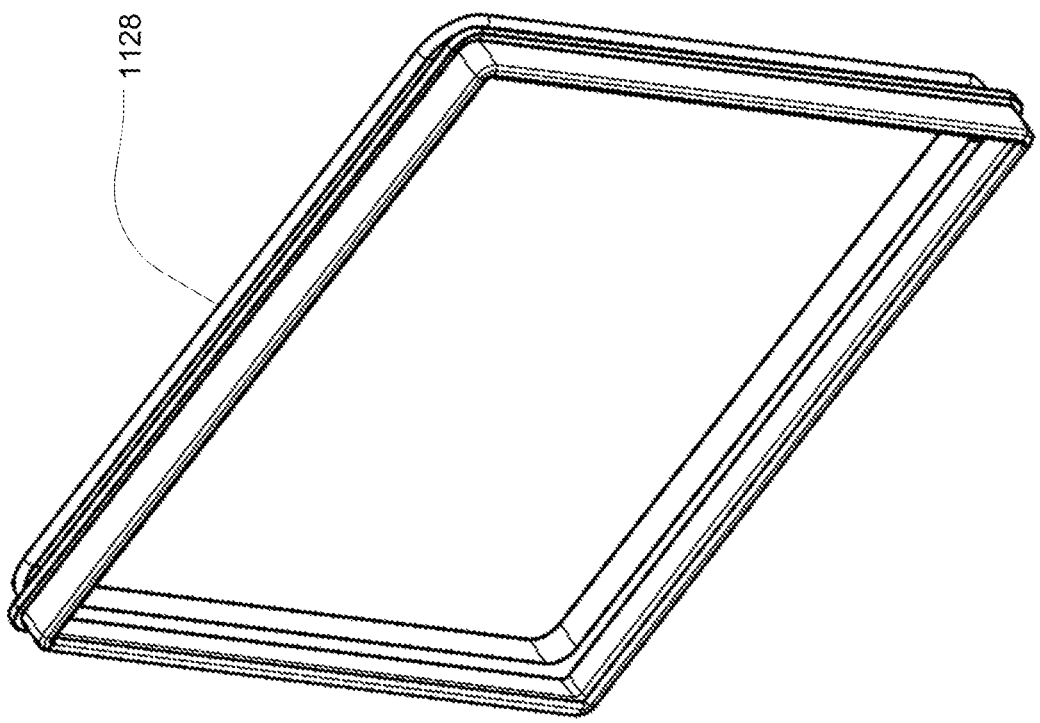
FIGS. 18A and 18B respectively show top and bottom perspective views of an example seal for the seal carrier of the lid assembly of FIG. 13.
Figure 18A:
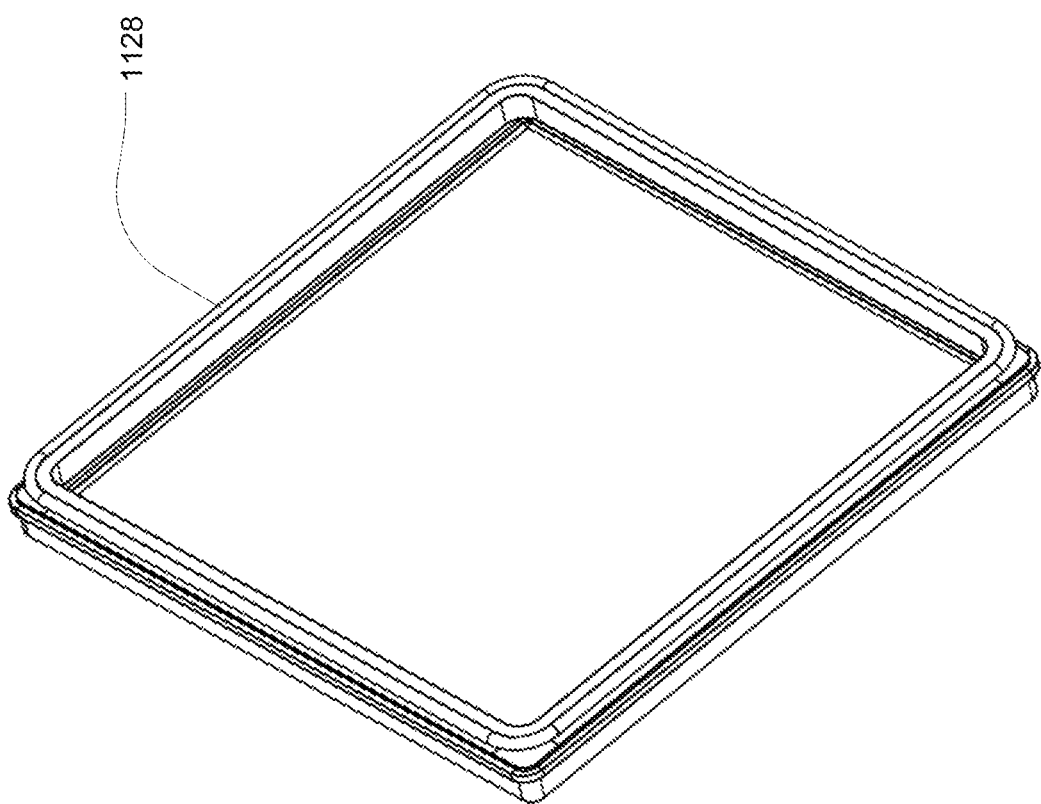
Figure 19B:
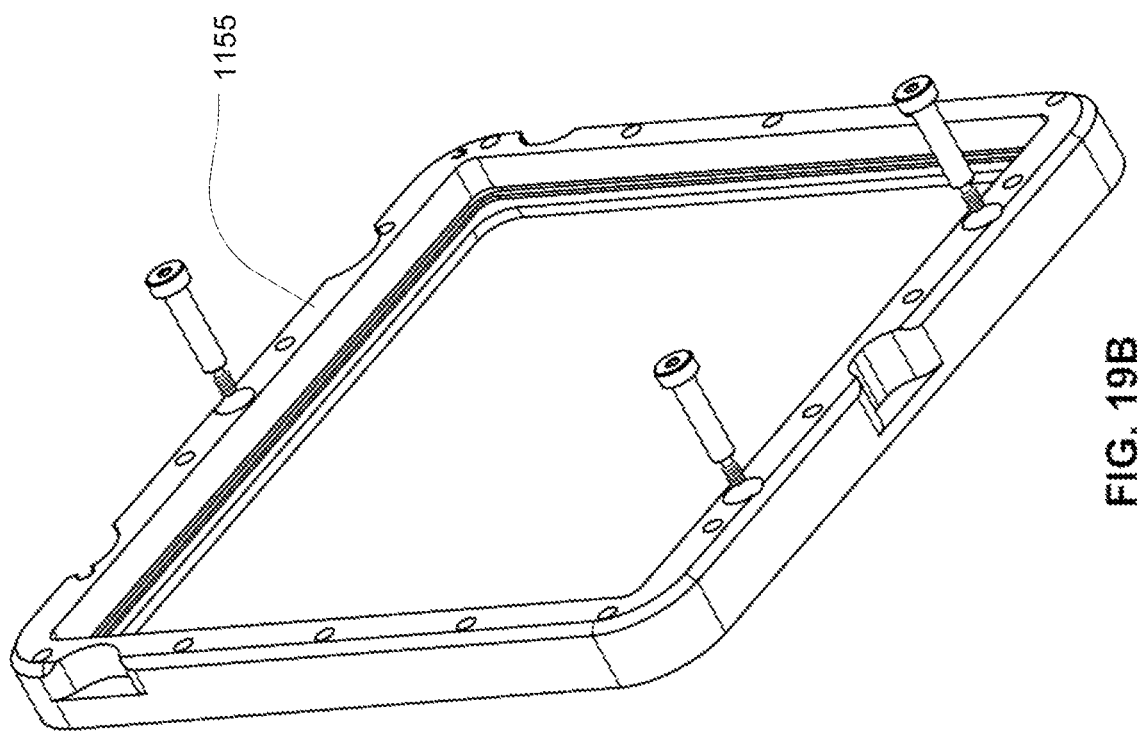
FIGS. 19A and 19B respectively show top and bottom perspective views of an example seal clamp for the seal carrier of the lid assembly of FIG. 13.
Figure 19A:
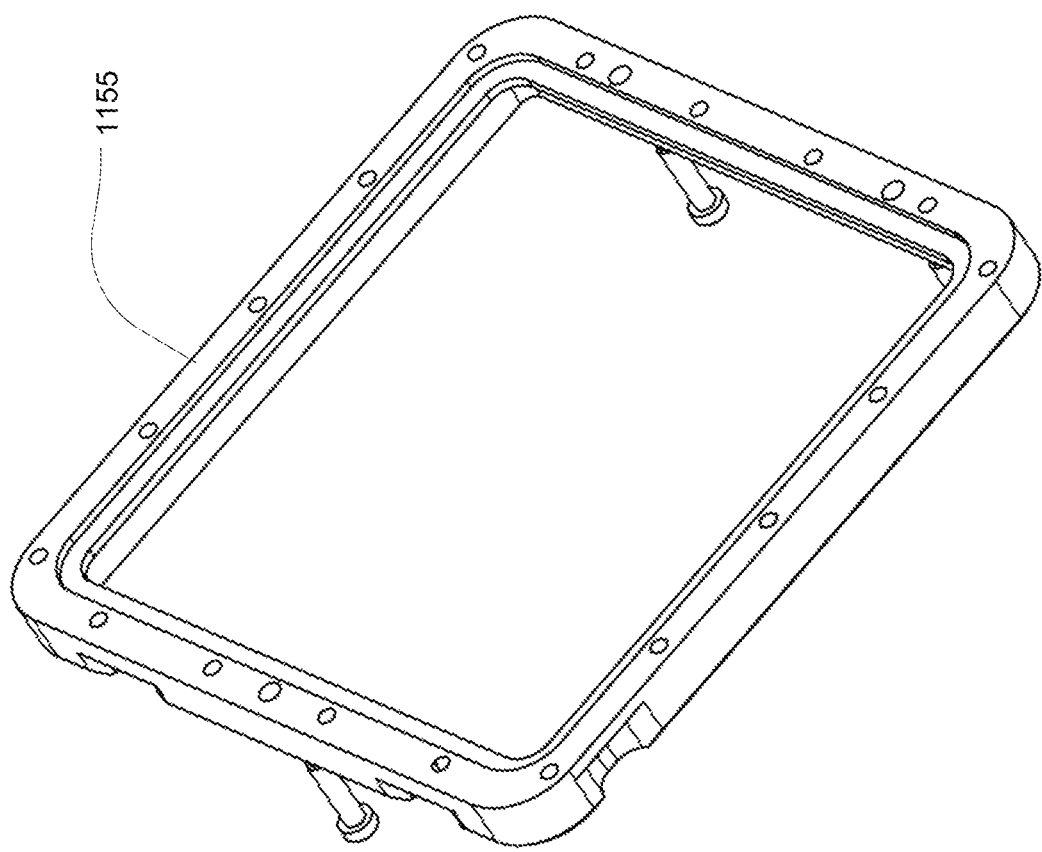

In this version, the lid includes a cap portion 1117, perimeter rim portion 1119, and a trunk portion 1121. The lid cold plate 1111 is included on the surface of the trunk portion 1121. As seen in FIG. 16A the lid cold plate 1111 includes circuitous channels CC for directing fluid circulation about the plate. The channels may form a path that winds in and out around sensor mounts for the sensors. The channels may include raised tabs CTB to increase fluid-to-plate surface contact. Any of such cold plates described herein may also include an array of sub-millimeter channels (micro-channels). Such micro-channels may have high aspect ratios (channel-height-to-width), e.g., approximately 9:1. 10:1 or 11:1 etc.) Moreover, the raised tabs of such a cold plate may have high aspect ratios (tab-height-to-width), e.g., approximately 9:1. 10:1 or 11:1 etc.). These features can help to achieve the high-heat flux previously described.

The perimeter rim portion 1119 of the lid 1124 forms a channel portion 1123 near the perimeter of the lid. (See FIG. 15B.) When inserted in the outer housing so as to cover the test socket, a bottom surface part of the perimeter rim portion 1119 engages with a top surface 1125 of the outer housing 1103. In this position, the bottom surface of the trunk at the cold plate is narrowly spaced away from the socket or any DUT(s) in the test socket so as to form part of the pressure chamber 1131 as previously described.

The seal carrier 1120 moveably engages with the lid about the trunk portion of the lid. Thus, the dimension of the trunk portion is marginally smaller than the interior cavity formed by the inner surface sides of the seal carrier. In this version, the seal carrier includes a perimeter projection portion 1133, a top extension portion 1135 and a flange portion 1137. The top extension portion traverses within the limits of the channel portion 1123 of the lid 1124. In this regard, the top extension portion 1135 includes an interior seal 1139 at a surface of the lid in the channel portion. Thus, the interior seal prevents pneumatic leaks between the surface of the lid and the surface of the seal carrier.

The seal carrier includes a main seal 1128 that skirts the bottom surface of the perimeter of the seal carrier. This main seal is applied to the seal carrier at its flange portion 1137. This compliant seal (e.g., flapper foot), such as at a bottom edge, may engage a surface of a tile (e.g., outer perimeter top surface of the tile) in the test socket as previously described for pneumatically sealing the DUT(s)/tile within the pressure chamber. Beneficially, the top surface of the top extension portion 1135 and the bottom surface of the flange portion (such as with a portion of the main seal) may be formed with an equal surface area (i.e., top surface area matched to bottom surface area). Such a configuration can balance the pressure forces in the pressure chamber so that the pressure force below the seal carrier (bottom up) and above the seal carrier (top down) cancel. Thus, the pneumatic pressure of the chamber does not affect movement (upward or downward) of the seal carrier. Rather, the seal carrier, relative to the lid, is biased in a downward direction, such as by mechanical springs (not shown), to maintain the desired contact between the compliant main seal and tile, independent of pneumatic pressure. This mechanical seal contact serves to urge the tile, at the perimeter of the tile, into the desired position in the socket (e.g., to abut the pins 1144 of the socket and extensions of the cold plate (not shown in FIG. 11) near the edge of the tile). However, in some versions the areas may be different or unmatched so as to permit some pressure bias against the seal carrier to induce a net force toward the tile or alternatively away from the tile.

The main seal 1128 may be clamped with the seal carrier with a seal clamp 1155. As seen in FIG. 11, a surface of the seal clamp 1155 engages with the perimeter projection portion 1133 of the seal carrier 1120. In this version, the seal clamp 1155 may be sized to encompass an outer perimeter of the main seal 1128 as seen in FIG. 11. As illustrated in FIG. 13, the seal clamp 1155 may be secured to the seal carrier 1120 with, for example, bolts or screws, so that the seal clamp forms a lower portion of the seal carrier 1120. Thus, the seal clamp moves with the seal carrier 1120.

As illustrated in FIG. 11 and previously described, the pressure of the pressure chamber 1131 centrally urges, by pressure force, the tile in contact with the spring biased pins 1144 residing between the PCB 1138 and a tile 1110 in the test socket 1145. Similarly, as previously described, the pressure centrally urges the tile to contact with the extensions (not shown in FIG. 11) of the PCB related cold place 1134. As previously discussed, these forces also serve to urge the PCB into electrical contact with the cold plate via optional conductive contacts (not shown in FIG. 11) between the PCB and cold plate. Thus, vertical positioning of the tile in the test socket may be achieved by mechanical and pneumatic forces supplied by the system.

Figure 12:
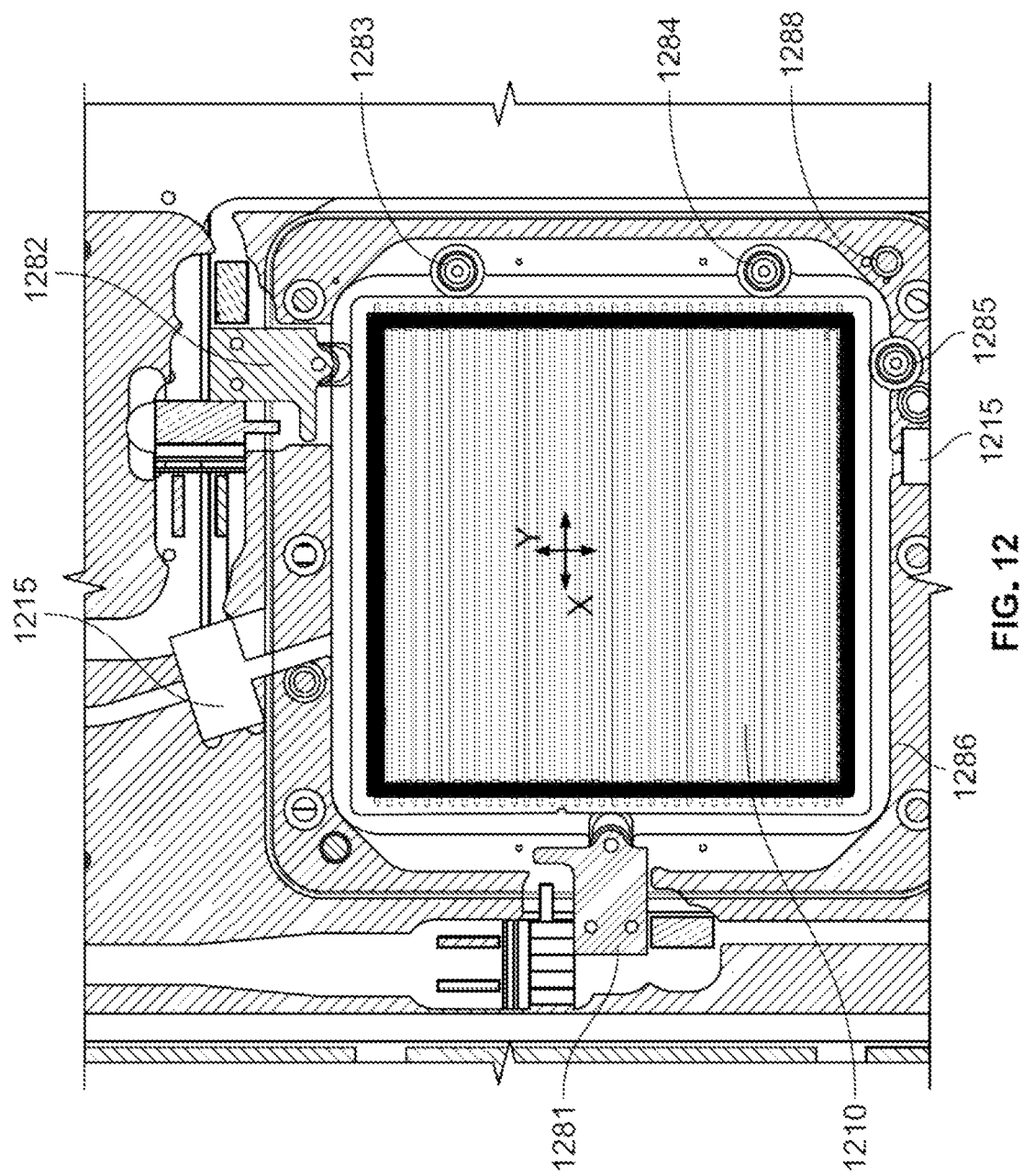
FIG. 12 is a plan view of a tile resting in a wafer receptacle or a socket that may be implemented in some versions, such as for an automated burn-in system.

An example tile/wafer receptacle is illustrated in FIG. 12. The receptacle may be used either as a temporary holding bay for tiles before or after testing. The receptacle may also be used as an outer housing for a test socket. As illustrated, a tile 1210 may be positioned/aligned in a desired location (e.g., horizontal positioning in the socket or holding bay) with the use of automated positioning/alignment apparatus. In the example of FIG. 12, sensors 1215 may detect presence of a tile to begin an alignment process. Sensors 1215, such as a laser emitter and laser detector, may also detect one or more datums (e.g., marks) on the tile indicating that the tile is out of position. The alignment process activates pneumatic actuators 1282, 1281 that may be positioned for applying force to the tile in perpendicular directions. For example, the actuator 1282 may extend a piston to push the tile in a direction labeled by the Y axis and the actuator 1281 may extend a piston to push the tile in a direction labeled by the X axis. Such pushing by the actuators moves the tile toward alignment pins 1283, 1284, 1285. The alignment pins may include radial bearings that allow the tile to glide along the bearing into the desired position. Optionally, the receptacle housing 1286 may include orientation structures 1288 for installing the receptacle in an appropriate/known orientation in relation to the outer housing and/or test socket. For example, the receptacle housing may include apertures to receive pins of an outer housing or vice versa. In the case where the receptacle is applied as an outer housing for a test socket, the orientation structures may be configured for suitable placement of the outer housing over a test socket. Moreover, one or more such orientation features may promote alignment between the lid assembly and the outer housing to promote proper alignment of the lid assembly when being lowered onto the outer housing for testing operations.

With such apparatus, burn-in testing operations may be implemented with minimal human interaction. For example, one or more controllers (e.g., programmable microcontroller(s) having, for example, a processor and memory, and input output devices for generating peripheral device control signals) may be configured for operating the various components (e.g., alignment apparatus, lift and carrier) to control an automated burn-in testing of one or more tiles. Such operations may be considered in relation to FIG. 12. When a tile is placed in the tile receptacle 1010, a controller may detect and align the tile into a desired pick up position with the alignment apparatus previously described. A controller may then activate the carrier apparatus 1020 to move the vacuum chuck 1012 over the tile. A controller may then control activation of a suction process to capture the tile. A controller may then (or previously) control activation of the lift to raise the lid assembly in direction D. A controller may then control movement of the carrier apparatus in directions A, B and C to move the carrier apparatus under the raised lid assembly 1024 and over the test socket. A controller may then control the carrier apparatus for movement of the vacuum chuck down to the test socket and deactivation of the vacuum to release the tile into the test socket. A controller may then control the alignment apparatus of the test socket to horizontally position the tile in the test socket. A controller may then control the carrier apparatus to return to a position near the receptacle 1010. A controller may then control the lift to lower and lock the lid assembly into place above the socket and thereby setting the seal of the seal carrier onto a surface of the tile of the socket. A controller may then control activation of pressurization of the pressure chamber to engage thermal and electrical contact of the tile in the socket and thereby achieve a desired vertical positioning of the tile in the socket. A controller may then control activation/de-activation of a burn-in test. One or more controllers may then control the reverse process by depressurizing the pressure chamber, unlocking the lid assembly, lifting the lid assembly, retrieving the tested tile with the carrier apparatus and returning the tile to the receptacle. The controller(s) may then repeat the processes for additional tiles/wafer.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims. For example, although various cold plates are disclosed in some versions, other components of the apparatus may be configured as a cold plate. In one example, the seal carrier in any versions described herein may be liquid cooled. Such a seal carrier may include integrated passages for circulating fluid through the seal carrier. Moreover, in some versions the cold plate may form a surface that is part of the pressure chamber above a tile. In some versions, a cold plate may, in addition thereto or alternatively, form a surface that is part of the pressure chamber beneath the tile.

Further examples of the technology may be considered in relation to the following itemized paragraphs.

Example 1. A burn-in test apparatus for semiconductor devices, the test apparatus comprising:

an outer housing forming an aperture with a test socket to receive a tile, the tile comprising at least one semiconductor device for burn-in testing;

a thermal control unit configured to regulate temperature associated with the burn-in testing;

an inlet for gas pressure from a pressure source;

a lid to cover the aperture when a tile is at the test socket; and a seal carrier located within the aperture to form a pressure chamber with a first surface of the tile, the pressure chamber pneumatically coupled with inlet.

Example 2. The burn-in test apparatus of Example 1 wherein the seal carrier comprises a flange with a flexible seal, the flexible seal extending from the flange for contacting the first surface of the tile.

Example 3. The burn-in test apparatus of Example 2 wherein the flexible seal comprises a perimeter skirt for engaging a perimeter of the tile when the tile is in the test socket.

Example 4. The burn-in test apparatus of any one of Examples 1 to 3 further comprising a lid seal, the lid seal configured to maintain a pressure of the pressure chamber.

Example 5. The burn-in test apparatus of Example 4 wherein the lid seal is positioned to seal surfaces of the lid and the seal carrier.

Example 6. The burn-in test apparatus of Example 4 wherein the lid seal is positioned to seal surfaces of the lid and the outer housing.

Example 7. The burn-in test apparatus of any one of Examples 1 to 5 wherein the seal carrier and the lid form an integrated lid assembly.

Example 8. The burn-in test apparatus of Example 7 wherein the seal carrier has a limited range of movement relative to the lid.

Example 9. The burn-in test apparatus of any one of Examples 1 to 7 wherein the lid comprises a trunk portion, a cap portion, a perimeter rim portion and a channel portion, the channel portion being between the trunk portion and perimeter rim portion.

Example 10. The burn-in test apparatus of Example 9 wherein the trunk portion of the lid extends within a central aperture of the seal carrier.

Example 11. The burn-in test apparatus of any one of Examples 9 to 10 wherein an extension portion of the seal carrier is configured to traverse within the channel portion of the lid.

Example 12. The burn-in test apparatus of any one of Examples 1 to 11 wherein the seal carrier is spring biased with respect to the lid.

Example 13. The burn-in test apparatus of Example 12 wherein the bias is away from the lid.

Example 14. The burn-in test apparatus of any one of Examples 1 to 13 wherein opposing surfaces of the seal carrier that are exposed to gas pressure of the chamber have matching areas for neutralizing gas pressure forces applied to the opposing surfaces of the seal carrier by pneumatic pressure of the pressure chamber.

Example 15. The burn-in test apparatus of any one of Examples 1 to 13 wherein opposing surfaces of the seal carrier that are exposed to gas pressure of the chamber have unmatched areas for biasing gas pressure applied to opposing surfaces of the seal carrier by pneumatic pressure of the pressure chamber.

Example 16. The burn-in test apparatus of any one of Examples 1 to 15 wherein the lid comprises a cold plate.

Example 17. The burn-in test apparatus of Example 16 wherein the cold plate forms the pressure chamber with the seal carrier.

Example 18. The burn-in test apparatus of any one of Examples 16 to 17 wherein the cold plate includes a circuitous channel for directing fluid flow about the cold plate.

Example 19. The burn-in test apparatus of Example 18 wherein the circuitous channel includes a plurality of raised tabs along a path of the circuitous channel.

Example 20. The burn-in test apparatus of any one of Examples 1 to 19 wherein the lid comprises an electromagnetic radiation absorbing coating to absorb radiation within the pressure chamber.

Example 21. The burn-in test apparatus of any one of Examples 16 to 20 wherein a trunk of the lid comprises a manifold for fluid circulation adjacent to the cold plate, and wherein the lid further comprises a fluid inlet and a fluid outlet for the fluid circulation.

Example 22. The burn-in test apparatus of any one of Examples 1 to 21 wherein the lid comprises one or more sensors, the one or more sensors for sensing a temperature condition associated with the tile.

Example 23. The burn-in test apparatus of Example 22 wherein a sensor of the one or more sensors senses a temperature condition associated with a top surface of the tile.

Example 24. The burn-in test apparatus of any one of Examples 1 to 22 further comprising the pressure source, wherein the pressure source comprises a compressor.

Example 25. The burn-in test apparatus of any one of Examples 1 to 24 wherein the pressure chamber is configured to apply pressure from the inlet to the tile to urge the tile into electrical contact with the test socket.

Example 26. The burn-in test apparatus of any one of Examples 1 to 25 wherein the pressure chamber is configured to apply gas pressure from the inlet to the tile to urge the tile into thermal contact with a thermal conductor of the test socket.

Example 27. The burn-in test apparatus of any one of Examples 1 to 26 wherein the test socket comprises a printed circuit board, the printed circuit board configured with electrical contacts on a first surface side of the printed circuit board for energizing the tile when the tile is seated in the test socket, and wherein the test socket comprises a plurality of pins, the plurality of pins being spring biased and configured to engage electrically with conductive contact pads on a second surface of the tile opposite the first surface and to engage electrically with the first surface side of the printed circuit board, and wherein the pressure chamber is configured to apply pressure from the inlet to the tile to urge the tile to compress the pins.

Example 28. The burn-in test apparatus of Example 27 wherein the socket comprises a cold plate, the cold plate comprising a set of thermally conductive extensions with edges configured to contact a second surface of the tile, the second surface opposite the first surface, and optionally wherein the set of thermally conductive extensions each have a thermal interface material at its contact surface.

Example 29. The burn-in test apparatus of Example 28 wherein the cold plate is formed of an electrically conductive material and wherein the cold plate serves as a part of an electrical circuit of the test socket for energizing the tile when the tile is seated in the socket.

Example 30. The burn-in test apparatus of Example 29 wherein the cold plate comprises a raised platform portion from which the set of thermally conductive extensions extend, wherein a peripheral grove is formed in the cold plate about the raised platform.

Example 31. The burn-in test apparatus of Example 29 wherein the cold plate is in electrical contact with conductive pads of a second surface side of the printed circuit board, the second surface side opposite the first surface side.

Example 32. The burn-in test apparatus of any one of Examples 27 to 31 wherein the cold plate comprises groves to receive contacts coupled to the printed circuit board on a second surface side of the printed circuit board.

Example 33. The burn-in test apparatus of Example 31 wherein the cold plate is configured as an electrical ground in the electrical circuit.

Example 34. The burn-in test apparatus of Example 28 wherein the cold plate is located below the socket and a printed circuit board of the socket.

Example 35. The burn-in test apparatus of Example 34 wherein the set of thermally conductive extensions of the cold plate extend through slots of the printed circuit board of the socket.

Example 36. The burn-in test apparatus of any one of Examples 1 to 35 further comprising a tile carrier configured to automatically move the tile to the test socket when the lid exposes the aperture, the tile carrier comprising a vacuum chuck to hold the tile by vacuum force.

Example 37. The burn-in test apparatus of Example 36 wherein the tile carrier comprises a multi-axis pick and place robot.

Example 38. The burn-in test apparatus of any one of Examples 1 to 37 wherein the lid comprises an electromechanical or pneumatic lift to automatically raise and lower the lid for insertion and removal of the tile from the test socket.

Example 39. The burn-in test apparatus of any one of Examples 1 to 38 wherein the test socket further comprises alignment apparatus to automatically move the tile to a burn-in position in the test socket.

Example 40. The burn-in test apparatus of Example 39 wherein the alignment apparatus comprises any one or more of: one or more pneumatic actuators, one or more wheels, one or more fixed positional references, and one or more position sensors.

Example 41. The burn-in test apparatus of any one of Examples 1 to 40 further comprising a tile receptacle, the tile receptacle comprising alignment apparatus to automatically align the tile to a lift position in the tile receptacle for lifting by a pick and place robot.

Example 42. The burn-in test apparatus of any one of Examples 1 to 41 further comprising a controller, the controller configured to:
control automatic operation of the lid to open and close the test socket;
control automatic operation of a pick and place robot that moves the tile into and from the test socket when movement of the lid exposes the aperture;
control drive electronics for powering the test socket to conduct burn-in testing of the tile;
control the thermal control unit to regulate a temperature of the burn-in test apparatus during the burn-in testing of the tile.

Example 43. A method for conducting burn-in testing of semiconductor devices, the method comprising using the burn-in test apparatus of any one of Examples 1 to 42 to burn-in test a tile.

Example 44. A method for conducting burn-in testing of semiconductor devices, the method comprising:
placing a semiconductor device under test (DUT) into a socket of a burn-in testing apparatus;
closing a lid of the burn-in testing apparatus to enclose the semiconductor DUT within a pressurizable chamber of the burn-in testing apparatus;
pneumatically pressurizing the chamber by a gas pressure source so as to urge the semiconductor DUT into electrical and/or thermal contact with the test socket;
energizing the test socket to conduct a burn-in test of the semiconductor DUT;
opening the lid of the burn-in testing apparatus; and
retrieving the tested semiconductor DUT from the test socket.

Example 45. The method of Example 44 further comprising engaging a flexible seal with a first side surface of the semiconductor DUT, the flexible seal engaging the semiconductor DUT for pressurizing the chamber.

Example 46. The method of Example 37 wherein the pneumatically pressurizing the chamber applies a force to the first side surface to compress a set of pins of the socket that contact semiconductor DUT on a second side surface of the semiconductor DUT.

Example 47. The method of Example 37 wherein the flexible seal engages with the first side surface of the semiconductor DUT at a perimeter of the semiconductor DUT.

Example 48. The method of Example 39 wherein closing the lid engages the flexible seal.

Example 49. The method of Example 37 further comprising regulating heat of the chamber with a cold plate positioned adjacent to the first side surface of the semiconductor DUT.

Example 50. The method of Example 41 further comprising absorbing electromagnetic radiation into the cold plate, the electromagnetic radiation generated by a semiconductor DUT during the burn-in testing.

Example 51. The method of Example 37 wherein energizing the socket applies electrical energy through a cold plate that is in electrical contact with a printed circuit board of the socket.

Example 52. The method of Example 43 further comprising transferring heat from a second side of the semiconductor DUT, the second side of the semiconductor DUT in contact with the cold plate.

Example 53. The method of Example 44 further comprising controlling operation of an actuator to automatically align the semiconductor DUT in the socket.

Example 54. The method of Example 45 further comprising controlling operation of an actuator to automatically align the semiconductor DUT in a holding receptacle.

Example 55. The method of Example 37 further comprising controlling automatic operation of the lid to open and close the test socket.

Example 56. The method of Example 47 further comprising:
controlling automatic operation of a pick and place robot that moves the semiconductor DUT into the test socket when a movement of the lid exposes the test socket; and
controlling automatic operation of the pick and place robot that moves the semiconductor DUT from the test socket when a further movement of the lid exposes the test socket.

The invention claimed is:

1. A method for conducting burn-in testing of semiconductor devices, the method comprising:
    placing a semiconductor device under test (DUT) into a seal carrier, the semiconductor DUT having a plurality of contact pads;
    placing the seal carrier within a plurality of first inner walls of an outer housing of a burn-in testing apparatus, the seal carrier having a plurality of second inner walls that define a recessed cavity, wherein the outer housing is fastened to a cold plate through a printed circuit board (PCB);
    placing a lid over the seal carrier;
    fastening the lid to the outer housing to seal the recessed cavity;
    pneumatically pressurizing the recessed cavity by a gas pressure source, thereby forcing the plurality of contact pads of the semiconductor DUT into electrical contact with a plurality of resiliently compressible pins of a socket of the PCB; and
    energizing the socket to conduct a burn-in test of the semiconductor DUT.

2. The method of claim 1, further comprising engaging a flexible seal with the semiconductor DUT, the flexible seal engaging the semiconductor DUT prior to pneumatically pressurizing the recessed cavity.

3. The method of claim 2, wherein the pneumatically pressurizing the recessed cavity applies a force to the semiconductor DUT to compress the plurality of resiliently compressible pins of the socket that contact the semiconductor DUT.

4. The method of claim 3, wherein the flexible seal engages with the semiconductor DUT at a perimeter of the semiconductor DUT.

5. The method of claim 2, further comprising:
    regulating heat of the cavity with the cold plate, wherein the cold plate is positioned adjacent to the semiconductor DUT; and
    absorbing electromagnetic radiation into the cold plate, the electromagnetic radiation generated by the semiconductor DUT during the burn-in testing.

6. The method of claim 2, wherein energizing the socket applies electrical energy through the cold plate that is in electrical contact with the PCB, the method further comprising:
    transferring heat from the semiconductor DUT, the semiconductor DUT being in contact with the cold plate; and
    controlling operation of an actuator to automatically align the semiconductor DUT in the socket.

7. The method of claim 1, further comprising:
    unfastening the lid from the outer housing; and
    retrieving the tested semiconductor DUT from the socket.

8. Apparatus for conducting burn-in testing of semiconductor devices, the apparatus comprising:
    a cold plate;
    a printed circuit board (PCB);
    an outer housing fastened to the cold plate through the PCB, the outer housing having a plurality of first inner walls, the outer housing being configured to receive a seal carrier placed within the plurality of first inner walls, wherein a semiconductor device under test (DUT) is placed in the seal carrier, the semiconductor DUT having a plurality of contact pads, and the seal carrier having a plurality of second inner walls that define a recessed cavity; and
    a lid configured to be placed over the seal carrier and fastened to the outer housing to seal the recessed cavity, wherein the recessed cavity is pneumatically pressurized by a gas pressure source, thereby forcing the plurality of contact pads of the semiconductor DUT into electrical contact with a plurality of resiliently compressible pins of a socket of the PCB, and the socket is energized to conduct a burn-in test of the semiconductor DUT.

9. Apparatus for conducting burn-in testing of semiconductor devices, the apparatus comprising:
    an outer housing having a plurality of first inner walls, the outer housing being configured to receive a seal carrier placed within the plurality of first inner walls, the seal carrier having a plurality of second inner walls that define a recessed cavity, wherein a semiconductor device under test (DUT) is placed within the recessed cavity, the semiconductor DUT including a plurality of contact pads;
    a lid configured to be placed over the seal carrier and fastened to the outer housing to seal the recessed cavity;
    a cold plate; and
    a printed circuit board (PCB), wherein:
        the outer housing is fastened to the cold plate through the PCB,
        the recessed cavity is pneumatically pressurized by a gas pressure source, thereby forcing the plurality of contact pads of the semiconductor DUT into electrical contact with a plurality of resiliently compressible pins of a socket of the PCB, and
        the socket is energized to conduct a burn-in test of the semiconductor DUT.

* * * * *